(12) United States Patent
Polyakov et al.

(10) Patent No.: US 8,222,799 B2
(45) Date of Patent: Jul. 17, 2012

(54) SURFACE DEFORMATION ELECTROACTIVE POLYMER TRANSDUCERS

(75) Inventors: Ilya Polyakov, San Francisco, CA (US); Chris A. Weaber, Montara, CA (US)

(73) Assignee: Bayer MaterialScience AG, Leverkusen (DE)

( * ) Notice: Subject to any disclaimer, the term of this patent is extended or adjusted under 35 U.S.C. 154(b) by 386 days.

(21) Appl. No.: 12/358,142

(22) Filed: Jan. 22, 2009

(65) Prior Publication Data

US 2010/0109486 A1    May 6, 2010

Related U.S. Application Data

(60) Provisional application No. 61/111,648, filed on Nov. 5, 2008.

(51) Int. Cl.
*H01L 41/047* (2006.01)
(52) U.S. Cl. .................... 310/365; 310/800
(58) Field of Classification Search .............. 310/365, 310/366, 800
See application file for complete search history.

(56) References Cited

U.S. PATENT DOCUMENTS

| | | |
|---|---|---|
| 6,343,129 B1 | 1/2002 | Pelrine et al. |
| 6,376,971 B1 | 4/2002 | Pelrine et al. |
| 6,543,110 B1 | 4/2003 | Pelrine et al. |
| 6,545,384 B1 | 4/2003 | Pelrine et al. |
| 6,583,533 B2 | 6/2003 | Kornbluh et al. |
| 6,586,859 B2 | 7/2003 | Kornbluh et al. |
| 6,628,040 B2 | 9/2003 | Pelrine et al. |
| 6,664,718 B2 | 12/2003 | Pelrine et al. |
| 6,707,236 B2 | 3/2004 | Pelrine et al. |
| 6,768,246 B2 | 7/2004 | Pelrine et al. |
| 6,781,284 B1 | 8/2004 | Pelrine et al. |
| 6,806,621 B2 | 10/2004 | Heim et al. |
| 6,809,462 B2 | 10/2004 | Pelrine et al. |
| 6,812,624 B1 | 11/2004 | Pei et al. |
| 6,876,135 B2 | 4/2005 | Pelrine et al. |
| 6,879,318 B1 | 4/2005 | Chan et al. |
| 6,882,086 B2 | 4/2005 | Kornbluh et al. |
| 6,891,317 B2 | 5/2005 | Pei et al. |
| 6,911,764 B2 | 6/2005 | Pelrine et al. |
| 6,940,221 B2 | 9/2005 | Matsukiyo et al. |
| 7,034,432 B1 | 4/2006 | Pelrine et al. |
| 7,049,732 B2 | 5/2006 | Pei et al. |
| 7,052,594 B2 | 5/2006 | Pelrine et al. |
| 7,062,055 B2 | 6/2006 | Pelrine et al. |
| 7,064,472 B2 | 6/2006 | Pelrine et al. |
| 7,166,953 B2 | 1/2007 | Heim et al. |
| 7,199,501 B2 | 4/2007 | Pei et al. |
| 7,211,937 B2 | 5/2007 | Kornbluh et al. |
| 7,224,106 B2 | 5/2007 | Pei et al. |
| 7,233,097 B2 | 6/2007 | Rosenthal et al. |
| 7,259,503 B2 | 8/2007 | Pei et al. |

(Continued)

FOREIGN PATENT DOCUMENTS

WO    WO 2004/086289    10/2004

*Primary Examiner* — Derek Rosenau
(74) *Attorney, Agent, or Firm* — John E. Mrozinski, Jr.

(57) ABSTRACT

The present invention provides electroactive polymer transducers configured for surface mode deformation to provide thickness mode actuation. The inventive transducers may find use in various applications, including but not limited to haptic feedback for user interface devices (e.g., key buttons, key pads, touch pads, touch screens, touch plates, touch sensors, etc.), fluid movement and control mechanism such as pumps and valves, breaking and clutch mechanisms, power generation, sensing, etc.

12 Claims, 15 Drawing Sheets

U.S. PATENT DOCUMENTS

| | | |
|---|---|---|
| 7,320,457 B2 | 1/2008 | Heim et al. |
| 7,362,032 B2 | 4/2008 | Pelrine et al. |
| 7,368,862 B2 | 5/2008 | Pelrine et al. |
| 7,378,783 B2 | 5/2008 | Pelrine et al. |
| 7,394,282 B2 | 7/2008 | Sinha et al. |
| 7,449,821 B2 * | 11/2008 | Dausch ............... 310/364 |
| 2005/0157893 A1 | 7/2005 | Pelrine et al. |
| 2006/0113880 A1 * | 6/2006 | Pei et al. ............... 310/800 |
| 2006/0197741 A1 | 9/2006 | Biggadike |
| 2006/0208609 A1 | 9/2006 | Heim |
| 2006/0208610 A1 | 9/2006 | Heim |
| 2006/0238079 A1 | 10/2006 | Pei et al. |
| 2007/0170822 A1 | 7/2007 | Pei et al. |
| 2007/0200453 A1 | 8/2007 | Heim |
| 2007/0200454 A1 | 8/2007 | Smith |
| 2007/0200457 A1 | 8/2007 | Heim et al. |
| 2007/0200466 A1 | 8/2007 | Heim |
| 2007/0200467 A1 | 8/2007 | Heydt et al. |
| 2007/0200468 A1 | 8/2007 | Heim |
| 2007/0230222 A1 | 10/2007 | Drabing et al. |
| 2008/0022517 A1 | 1/2008 | Rosenthal et al. |
| 2008/0116764 A1 | 5/2008 | Heim |
| 2008/0157631 A1 | 7/2008 | Heim et al. |
| 2008/0303782 A1 * | 12/2008 | Grant et al. ............... 345/156 |
| 2009/0001855 A1 | 1/2009 | Lipton et al. |

* cited by examiner

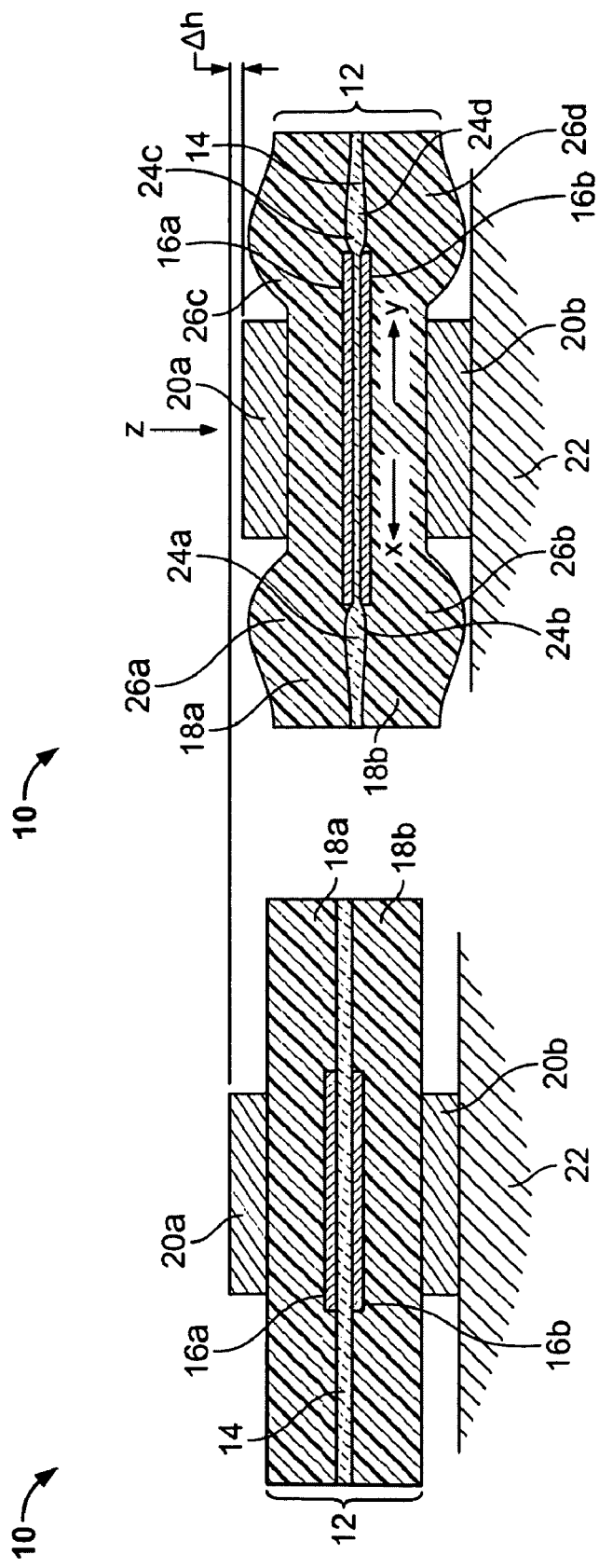

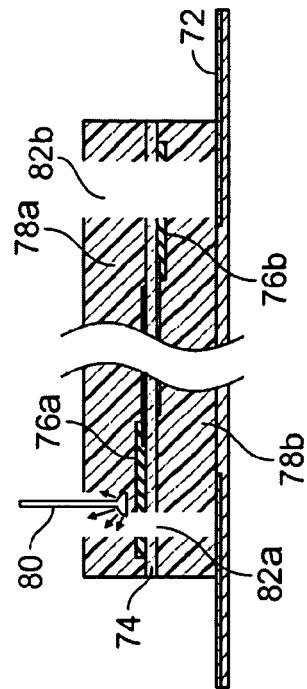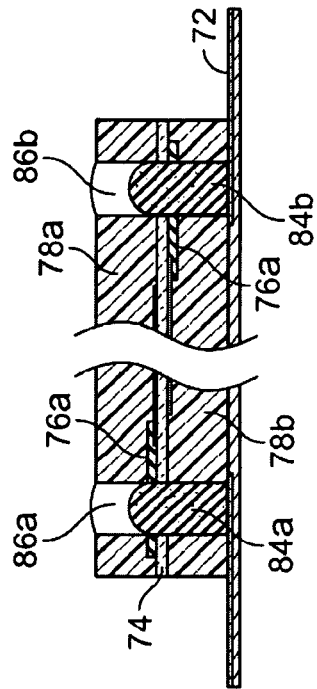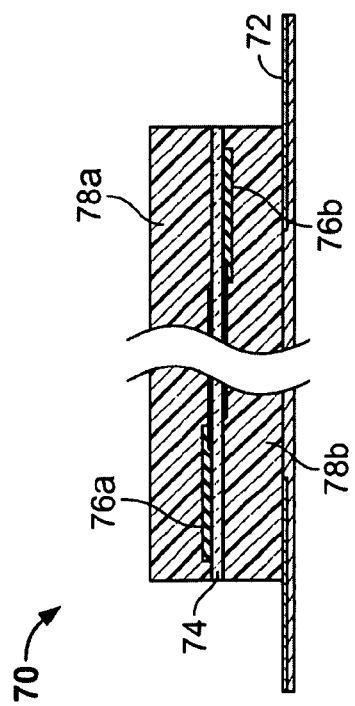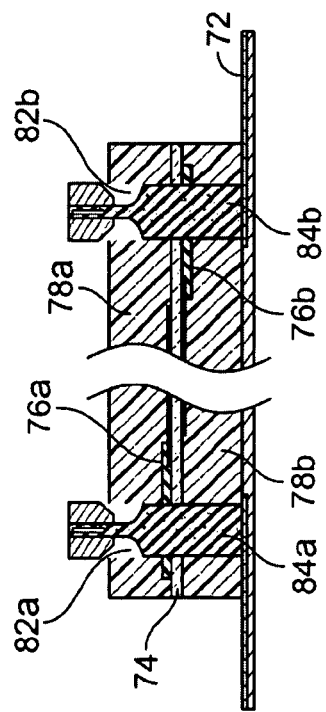
FIG. 3A
FIG. 3B
FIG. 3C
FIG. 3D

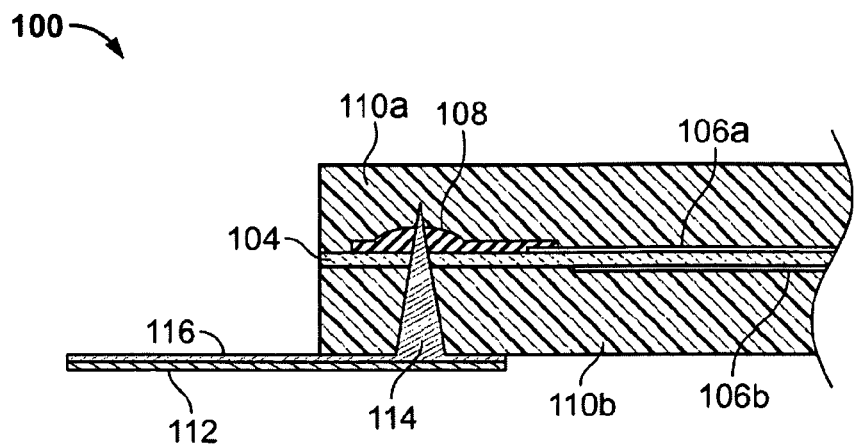
FIG. 5
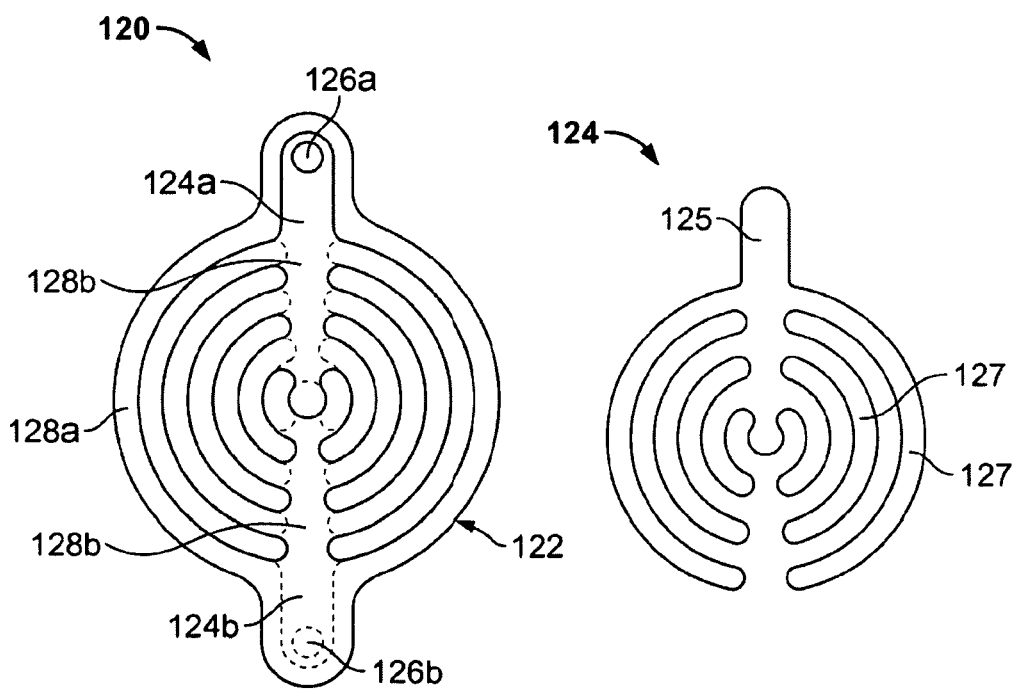
FIG. 6A  FIG. 6B

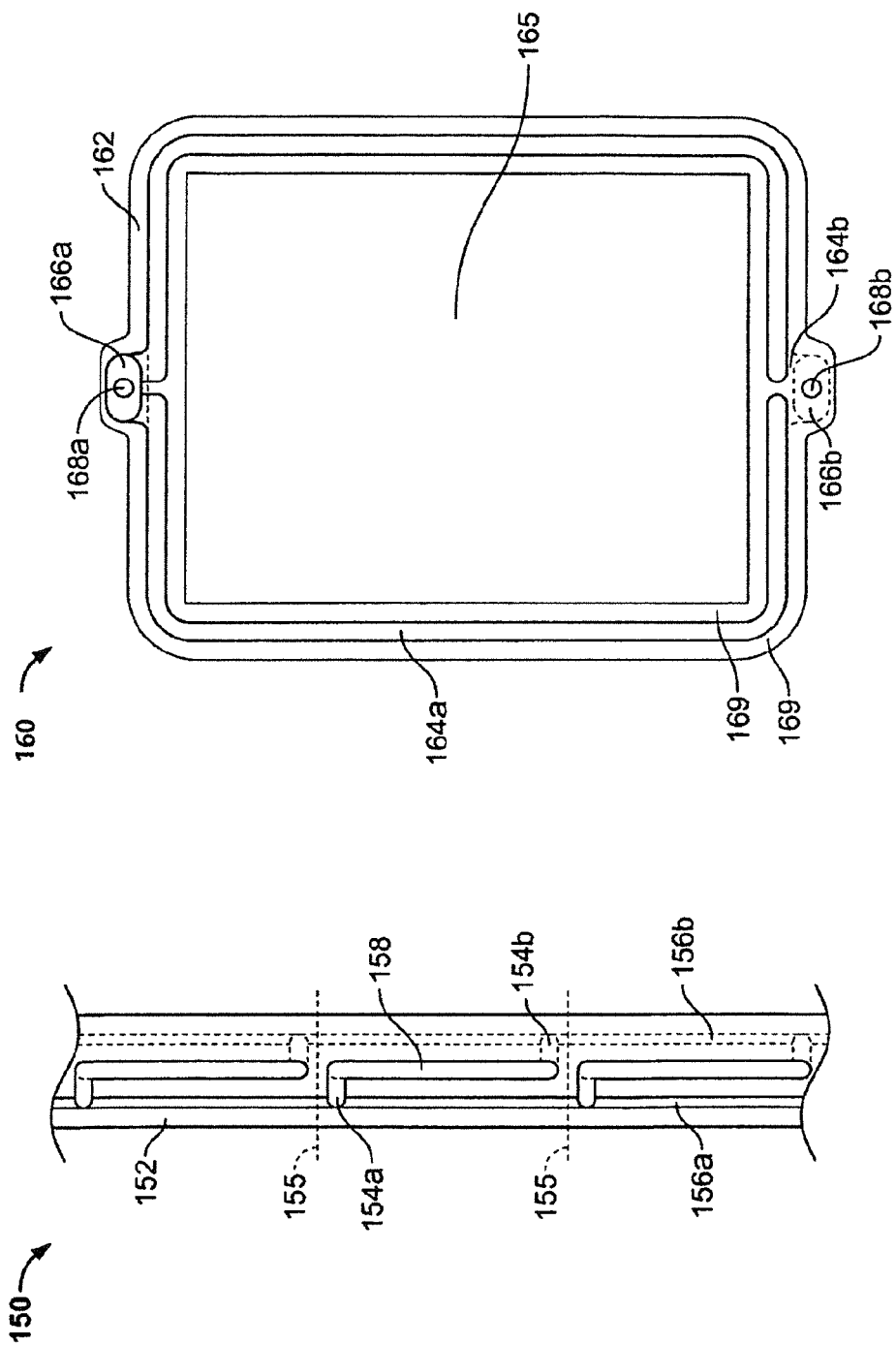

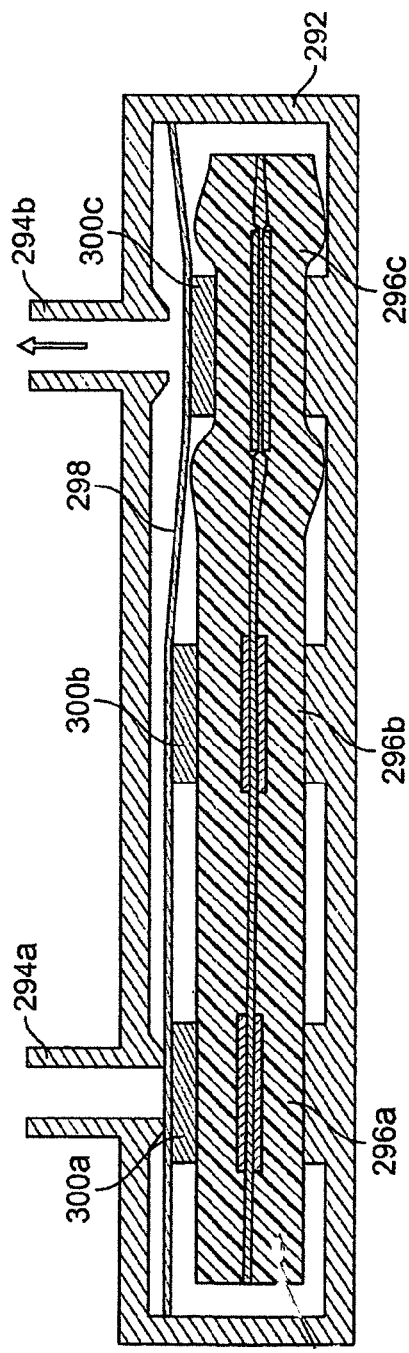
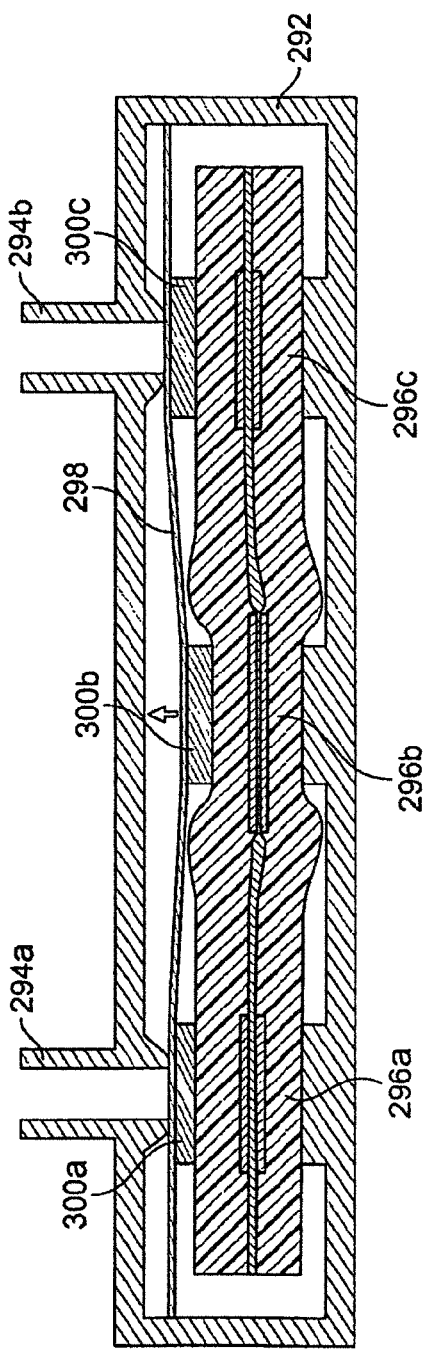
FIG. 14A
FIG. 14B

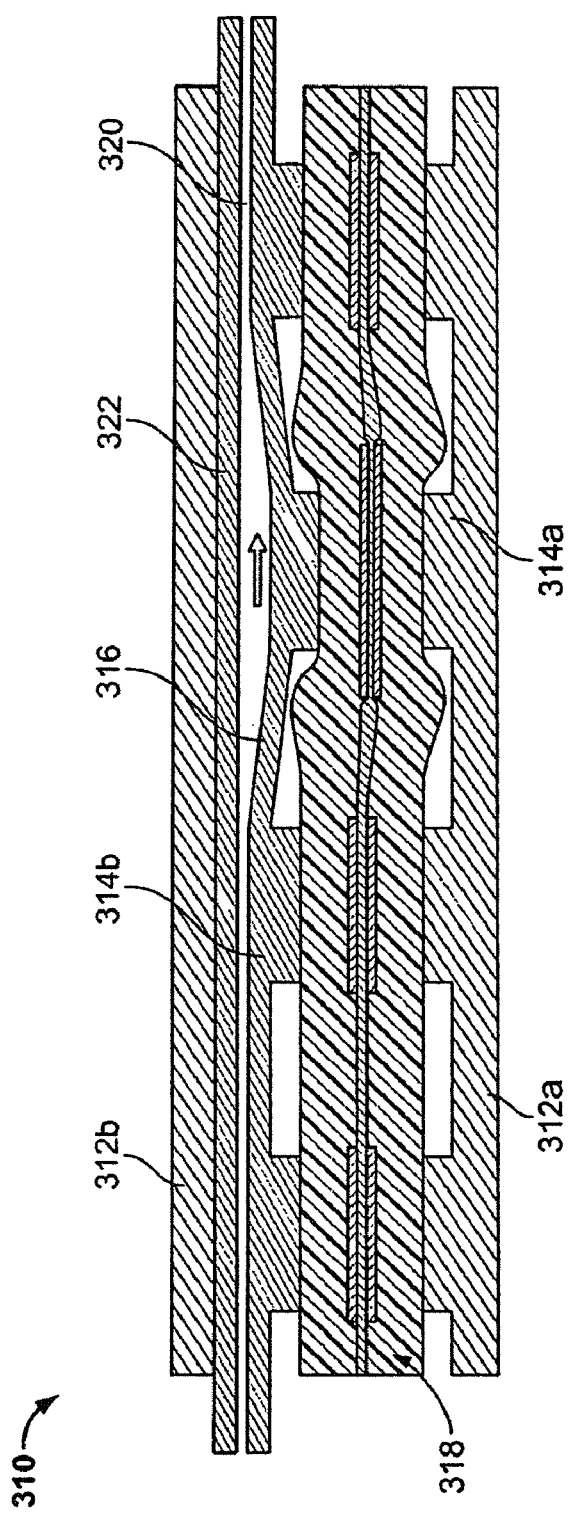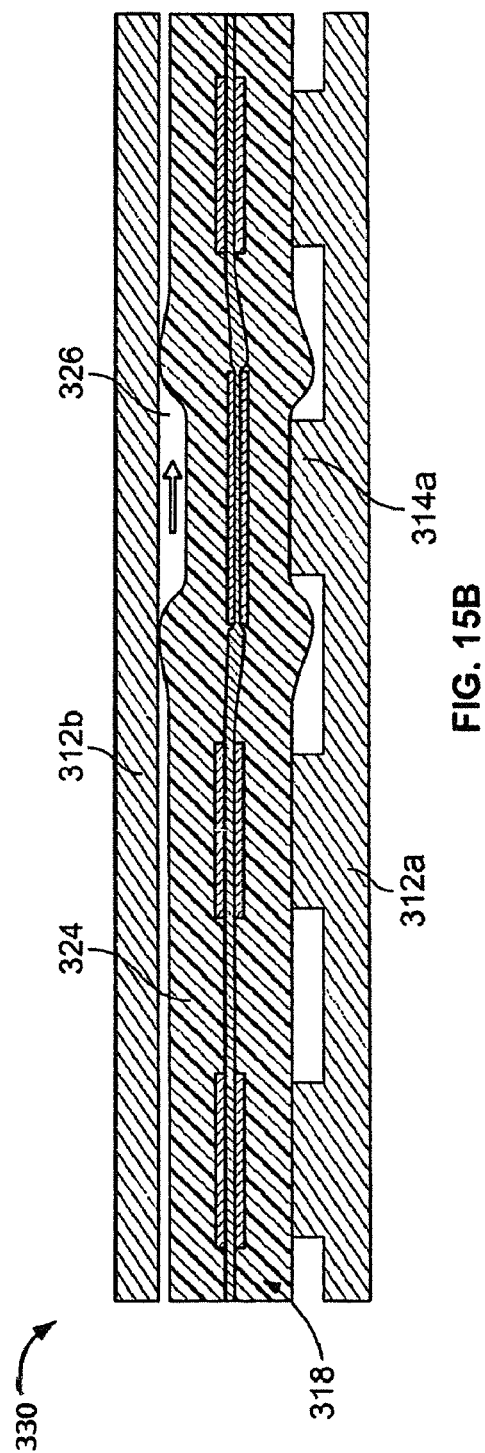
FIG. 15A
FIG. 15B

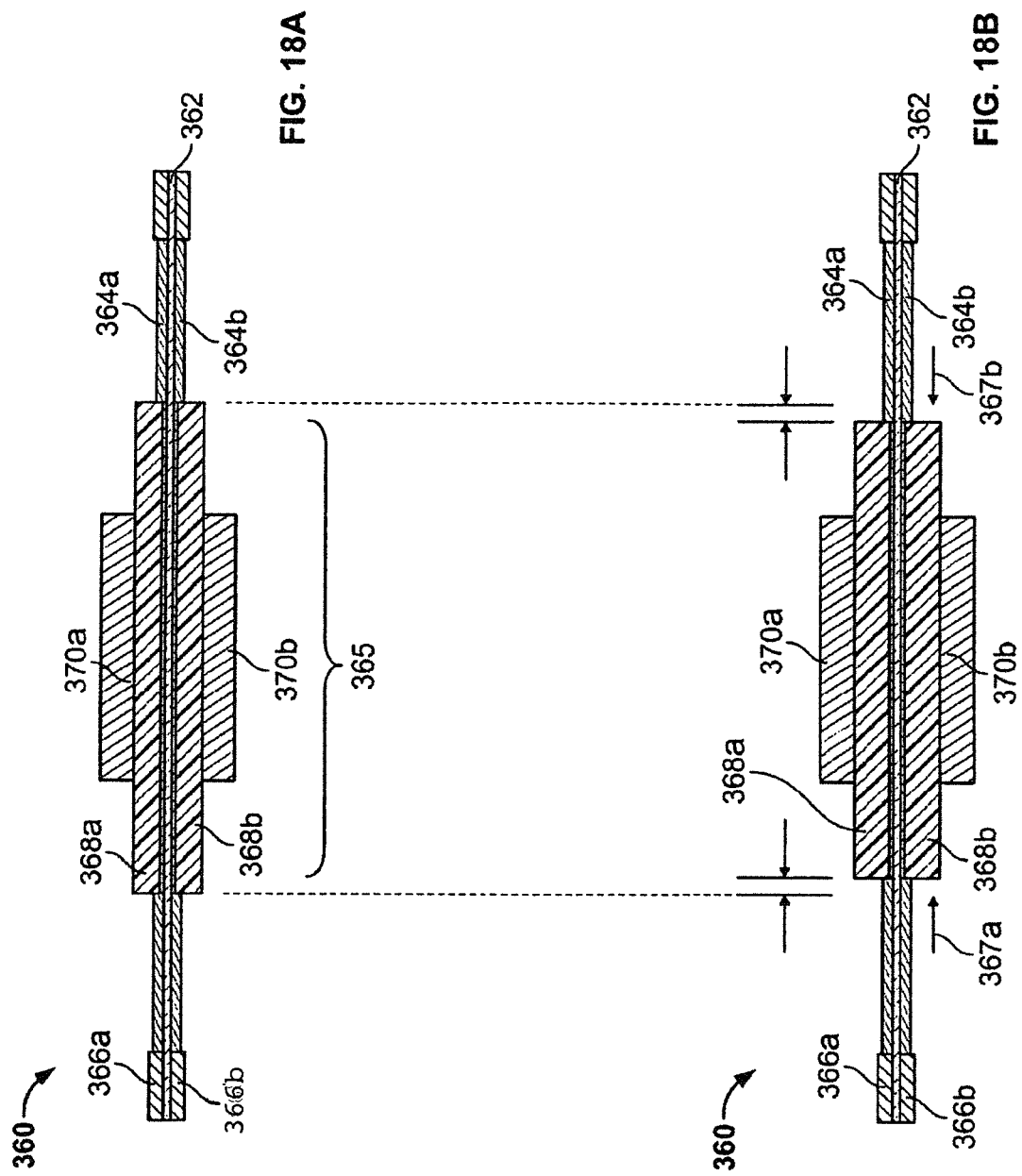

SURFACE DEFORMATION ELECTROACTIVE POLYMER TRANSDUCERS

CROSS-REFERENCE TO RELATED APPLICATION

This application is a non-provisional of U.S. Provisional Application No. 61/111,648 filed Nov. 5, 2008, the entirety of which is incorporated by reference herein.

FIELD OF THE INVENTION

The present invention relates to dielectric elastomer or electroactive polymer film transducers. More particularly, the present invention is related to such transducers and their abilities and applications related to surface deformation.

BACKGROUND OF THE INVENTION

A tremendous variety of devices used today rely on actuators of one sort or another to convert electrical energy to mechanical energy. Conversely, many power generation applications operate by converting mechanical action into electrical energy. Employed to harvest mechanical energy in this fashion, the same type of actuator may be referred to as a generator. Likewise, when the structure is employed to convert physical stimulus such as vibration or pressure into an electrical signal for measurement purposes, it may be characterized as a sensor. Yet, the term "transducer" may be used to generically refer to any of the devices.

A number of design considerations favor the selection and use of advanced dielectric elastomer materials, also referred to as "electroactive polymers" (EAPs), for the fabrication of transducers. These considerations include potential force, power density, power conversion/consumption, size, weight, cost, response time, duty cycle, service requirements, environmental impact, etc. As such, in many applications, EAP technology offers an ideal replacement for piezoelectric, shape-memory alloy (SMA) and electromagnetic devices such as motors and solenoids.

Examples of EAP devices and their applications are described in U.S. Pat. Nos. 7,394,282; 7,378,783; 7,368,862; 7,362,032; 7,320,457; 7,259,503; 7,233,097; 7,224,106; 7,211,937; 7,199,501; 7,166,953; 7,064,472; 7,062,055; 7,052,594; 7,049,732; 7,034,432; 6,940,221; 6,911,764; 6,891,317; 6,882,086; 6,876,135; 6,812,624; 6,809,462; 6,806,621; 6,781,284; 6,768,246; 6,707,236; 6,664,718; 6,628,040; 6,586,859; 6,583,533; 6,545,384; 6,543,110; 6,376,971 and 6,343,129; and in U.S. Patent Application Publication Nos. 2008/0157631; 2008/0116764; 2008/0022517; 2007/0230222; 2007/0200468; 2007/0200467; 2007/0200466; 2007/0200457; 2007/0200454; 2007/0200453; 2007/0170822; 2006/0238079; 2006/0208610; 2006/0208609; and 2005/0157893, the entireties of which are incorporated herein by reference.

An EAP transducer comprises two electrodes having deformable characteristics and separated by a thin elastomeric dielectric material. When a voltage difference is applied to the electrodes, the oppositely-charged electrodes attract each other thereby compressing the polymer dielectric layer therebetween. As the electrodes are pulled closer together, the dielectric polymer film becomes thinner (the z-axis component contracts) as it expands in the planar directions (along the x- and y-axes), i.e., the displacement of the film is in-plane. The EAP film may also be configured to produce movement in a direction orthogonal to the film structure (along the z-axis), i.e., the displacement of the film is out-of-plane. U.S. Patent Application Serial No. 2005/0157893 discloses EAP film constructs which provide such out-of-plane displacement—also referred to as surface deformation or thickness mode deflection.

The material and physical properties of the EAP film may be varied and controlled to customize the surface deformation undergone by the transducer. More specifically, factors such as the relative elasticity between the polymer film and the electrode material, the relative thickness between the polymer film and electrode material and/or the varying thickness of the polymer film and/or electrode material, the physical pattern of the polymer film and/or electrode material (to provide localized active and inactive areas), and the tension or pre-strain placed on the EAP film as a whole, and the amount of voltage applied to or capacitance induced upon the film may be controlled and varied to customize the surface features of the film when in an active mode.

Numerous transducer-based applications exist which would benefit from the advantages provided by such surface deformation EAP films.

SUMMARY OF THE INVENTION

The present invention seeks to improve upon the structure and function of surface deformation EAP-based transducers. The present invention provides customized transducer constructs for use in various applications, including but not limited to haptic feedback for user interface devices (e.g., key buttons, key pads, touch pads, touch screens, touch plates, touch sensors, etc.), fluid movement and control mechanism such as pumps and valves, breaking and clutch mechanisms, power generation, sensing, etc.

The transducers comprise at least one electroactive polymer film layer comprising a thin dielectric elastomer layer, wherein a portion of the dielectric elastomer layer is sandwiched between first and second electrodes wherein the overlapping portions of the electrodes define one or more active film regions with the remaining portion of film defining one or more inactive film regions, wherein activation of the active region chances a thickness dimension of the film. The relative positioning of the active region(s) and inactive region(s) defines the thickness mode output profile or the inactive region(s) may be central to the active region(s). Multiple transducers may be provided in a stacked arrangement to provide a multi-phase functionality and/or to enhance output.

To enhance the output of the change in thickness dimension, at least one passive polymer layer, the polymer layer extending over at least a portion of one side of the electroactive polymer film wherein activation of the active region also changes a thickness dimension of the passive layer. One or more of the passive layers may be mechanically coupled to one or more rigid structures which may form part of an actuator, and in certain embodiments, functions as an output mechanism. A passive layer may extend over portions or all of the active and the inactive regions, or may extend over only the inactive region or portions thereof.

In certain embodiments, electrical buses are provided to couple the electrodes to a source of power and/or to each other to provide a common ground, etc. In particular, a first conductive layer is disposed on at least a portion of the inactive film region and electrically coupled to the first electrode, and a second conductive layer is disposed on at least a portion of the inactive film region and electrically coupled to the second electrode. The transducers may further include one or more conductive vias extending through the transducer at a location which includes the first electrode and a second conductive via extending through the transducer at a location which includes the second electrode. The present invention provides a variety of methods for forming the vias within the electroactive transducer, which methods may include forming via holes within the transducer and filling them with a conductive material or, alternatively, driving a conductive contact into the transducer material.

The electrode layers of the subject transducers may have any suitable trace pattern for the thickness mode application at hand. The patterns are typically symmetrical, but may be asymmetrical, where the opposing traces appose each other from opposite sides of the dielectric film, wherein the areas of electrode apposition are active and the remaining areas are inactive, wherein activation of the active areas increases a thickness dimension of the inactive areas. In certain embodiments, the respective trace patterns comprises a plurality of substantially parallel, spaced apart traces which may in turn form a concentric pattern, extend substantially straight or selectively bend or curve to provide a novelty shape.

The transducers may be fabricated from a continuous strip of electroactive polymer film where individual transducers are formed by singulating them from the strip. The electrode patterns may be formed continuously along the strip or may be discrete and repeating along the strip. The transducer strip may be shaped to frame an open space, which is particularly suitable for constructing gasket-type actuators.

These and other features, objects and advantages of the invention will become apparent to those persons skilled in the art upon reading the details of the invention as more fully described below.

BRIEF DESCRIPTION OF THE DRAWINGS

The invention is best understood from the following detailed description when read in conjunction with the accompanying schematic drawings. To facilitate understanding, the same reference numerals have been used (where practical) to designate similar elements that are common to the drawings. Included in the drawings are the following:

FIGS. 1A and 1B schematically illustrate a surface deformation EAP transducer employed as an actuator which utilizes polymer surface features to provide work output when the transducer is activated;

FIGS. 3A-3D illustrate various steps of a process for making electrical connections within the subject transducers for coupling to a printed circuit board (PCB) or flex connector;

FIG. 5 is a cross-sectional view of a subject transducer having a piercing type of electrical contact;

FIGS. 6A and 6B are top views of a thickness mode transducer and electrode pattern, respectively, for application in a button-type actuator;

FIG. 9 illustrates a top view of thickness mode transducer in a continuous strip configuration;

FIG. 10 illustrates a top view of a thickness mode transducer for application in a gasket-type actuator;

FIGS. 14A and 14B are cross-sectional views of another diaphragm-type pump employing thickness mode actuators of the present invention with the pump undergoing exhaust and compression strokes, respectively;

FIGS. 15A and 15B are cross-sectional views of peristaltic pump embodiments employing thickness mode actuators of the present invention;

FIGS. 18A and 18B are cross-sectional views of another embodiment of a thickness mode transducer of the present invention in which the relative positions of the active and passive areas of the transducer are inversed from the above embodiments.

Figure 2A:
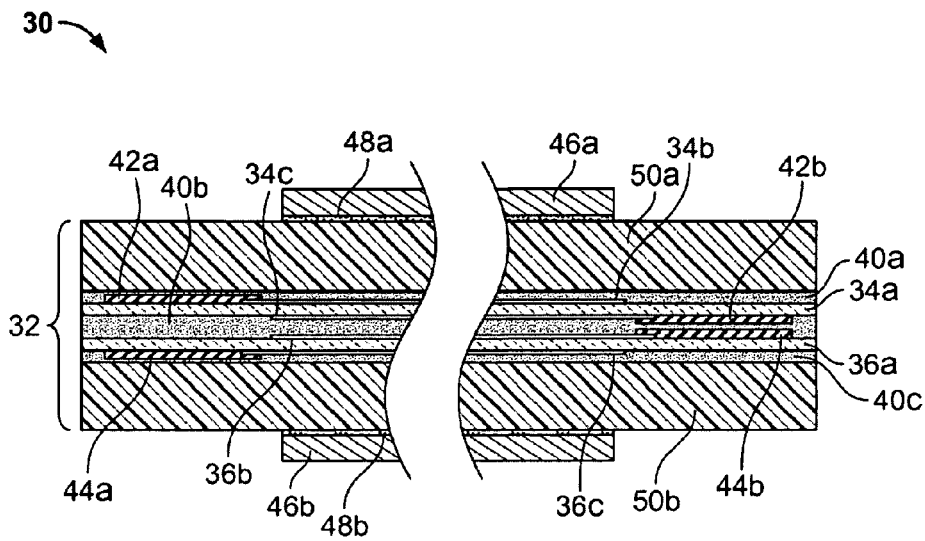
FIGS. 2A and 2B are cross-sectional views of exemplary constructs of an actuator of the present invention.

Variations of the invention from what is shown in the figures are contemplated.

DETAILED DESCRIPTION OF THE INVENTION

The devices, systems and methods of the present invention are now described in detail with reference to the accompanying figures.

Referring to FIGS. 1A and 1B, a schematic representation is provided of a surface deformation EAP actuator 10 for converting electrical energy to mechanical energy in accordance with one embodiment of the invention. Actuator 10 includes EAP transducer 12 having a thin elastomeric dielectric polymer layer 14 and top and bottom electrodes 16a, 16b attached to the dielectric 14 on portions of its top and bottom surfaces, respectively. The portion of transducer 12 comprising the dielectric and at least two electrodes is referred to herein as an active area. Any of the transducers of the present invention may have one or more active areas.

When a voltage difference is applied across the oppositely-charged electrodes 16a, 16b, the opposed electrodes attract each other thereby compressing the portion of the dielectric polymer layer 14 therebetween. As the electrodes 16a, 16b are pulled closer together (along the z-axis), the portion of the dielectric layer 14 between them becomes thinner as it expands in the planar directions (along the x- and y-axes). For incompressible polymers, i.e., those having a substantially constant volume under stress, or for otherwise compressible polymers held in a frame or the like, this action causes the compliant dielectric material outside the active area (i.e., the area covered by the electrodes), particularly perimetrically about, i.e., immediately around, the edges of the active area, to be displaced or bulge out-of-plane in the thickness direction (orthogonal to the plane defined by the transducer film). This bulging produces dielectric surface features 24a-d. While out-of-plane surface features 24 are shown relatively local to the active area, the out-of-plane is not always localized as shown. In some cases, if the polymer is pre-strained, then the surface features 24a-b are distributed over a surface area of the inactive portion of the dielectric material.

In order to amplify the vertical profile and/or visibility of surface features of the subject transducers, an optional passive layer may be added to one or both sides of the transducer film structure where the passive layer covers all or a portion of the EAP film surface area. In the actuator embodiment of FIGS. 1A and 1B, top and bottom passive layers 18a, 18b are attached to the top and bottom sides, respectively, of the EAP film 12. Activation of the actuator and the resulting surface features of dielectric layer 12 are amplified by the added thickness of passive layers 18a, 18b, as denoted by reference numbers 26a-d in FIG. 1B.

In addition to the elevated polymer/passive layer surface features 26a-d, the EAP film 12 may be configured such that the one or both electrodes 16a, 16b are depressed below the thickness of the dielectric layer. As such, the depressed electrode or portion thereof provides an electrode surface feature upon actuation of the EAP film 12 and the resulting deflection of dielectric material 14. Electrodes 16a, 16c may be patterned or designed to produce customized transducer film surface features which may comprise polymer surface features, electrode surface features and/or passive layer surface features.

In the actuator embodiment 10 of FIGS. 1A and 1B, one or more structures 20a, 20b are provided to facilitate coupling the work between the compliant passive slab and a rigid mechanical structure and directing the work output of the actuator. Here, top structure 20a (which may be in the form of a platform, bar, lever, rod, etc.) acts as an output member while bottom structure 20b serves to couple actuator 10 to a fixed or rigid stricture 22, such as ground. These output structures need not be discrete components but, rather, may be integrated or monolithic with the structure which the actuator is intended to drive. Structures 20a, 20b also serve to define the perimeter or shape of the surface features 26a-d formed by the passive layers 18a, 18b. In the illustrated embodiment, while the collective actuator stack produces an increase in thickness of the actuator's inactive portions, as shown in FIG. 1B, the net chance in height $\Delta h$ undergone by the actuator upon actuation is negative.

The EAP transducers of the present invention may have any suitable construct to provide the desired thickness mode actuation. For example, more than one EAP film layer may be used to fabricate the transducers for use in more complex applications, such as keyboard keys with integrated sensing capabilities where an additional EAP film layer may be employed as a capacitive sensor.

FIG. 2A illustrates such an actuator 30 employing a stacked transducer 32 having a double EAP film layer in accordance with the present invention. The double layer includes two dielectric elastomer films with the top film 34a sandwiched between top and bottom electrodes 34b, 34c, respectively, and the bottom film 36a sandwiched between top and bottom electrodes 36b, 36c, respectively. Pairs of conductive traces or layers (commonly referred to as "bus bars") are provided to couple the electrodes to the high voltage and ground sides of a source of power (the latter not shown). The bus bars are positioned on the "inactive" portions of the respective EAP films (i.e., the portions in which the top and bottom electrodes do not overlap). Top and bottom bus bars 42a, 42b are positioned on the top and bottom sides, respectively, of dielectric layer 34a, and top and bottom bus bars 44a, 44b positioned on the top and bottom sides, respectively, of dielectric layer 36a. The top electrode 34b of dielectric 34a and the bottom electrode 36c of dielectric 36a, i.e., the two outwardly facing electrodes, are commonly polarized by way of the mutual coupling of bus bars 42a and 44a through conductive elastomer via 68a (shown in FIG. 2B), the formation of which is described in greater detail below with respect to FIGS. 3A-3D. The bottom electrode 34c of dielectric 34a and the top electrode 36b of dielectric 36a, i.e., the two inwardly facing electrodes, are also commonly polarized by way of the mutual coupling of bus bars 42b and 44b through conductive elastomer via 68b (shown in FIG. 2B). Potting material 66a, 66b is used to seal via 68a, 68b. When operating the actuator, the opposing electrodes of each electrode pair are drawn together when a voltage is applied. For safety purposes, the ground electrodes may be placed on the outside of the stack so as to ground any piercing object before it reaches the high voltage electrodes, thus eliminating a shock hazard. The two EAP film layers may be adhered together by film-to-film adhesive 40b. The adhesive layer may optionally include a passive or slab layer to enhance performance. A top passive layer or slab 50a and a bottom passive layer 50b are adhered to the transducer structure by adhesive layer 40a and by adhesive layer 40c. Output bars 46a, 46b may be coupled to top and bottom passive layers, respectively, by adhesive layers 48a, 48b, respectfully.

The actuators of the present invention may employ any suitable number of transducer layers, where the number of layers may be even or odd. In the latter construct, one or more common ground electrode and bus bar may be used. Additionally, where safety is less of an issue, the high voltage electrodes may be positioned on the outside of the transducer stack to better accommodate a particular application.

To be operational, actuator 30 must be electrically coupled to a source of power and control electronics (neither are shown). This may be accomplished by way of electrical tracing or wires on the actuator or on a PCB or a flex connector 62 which couples the high voltage and ground vias 68a, 68b to a power supply or an intermediate connection. Actuator 30 may be packaged in a protective barrier material to seal it from humidity and environmental contaminants. Here, the protective barrier includes top and bottom covers 60, 64 which are preferably sealed about PCB/flex connector 62 to protect the actuator from external forces and strains and/or environmental exposure. In some embodiments, the protective barrier maybe impermeable to provide a hermetic seal. The covers may have a somewhat rigid form to shield actuator 30 against physical damage or may be compliant to allow room for actuation displacement of the actuator 30. In one specific embodiment, the top cover 60 is made of formed foil and the bottom cover 64 is made of a compliant foil, or vice versa, with the two covers then heat-sealed to board/connector 62. Many other packaging materials such as metalized polymer films, PVDC, Aclar, styrenic or olefinic copolymers, polyesters and polyolefins can also be used. Compliant material is used to cover the output structure or structures, here bar 46b, which translate actuator output.

The conductive components/layers of the stacked actuator/transducer structures of the present invention, such as actuator 30 just described, are commonly coupled by way of electrical vias (68a and 68b in FIG. 2B) formed through the stacked structure. FIGS. 3-5 illustrate various methods of the present invention for forming the vias.

Figure 2B:
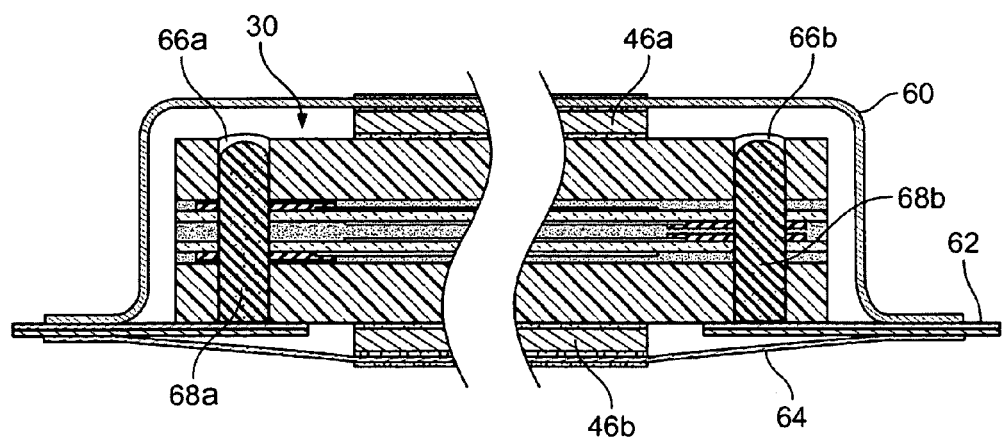

Formation of the conductive vias of the type employed in actuator 30 of FIG. 2B is described with reference to FIGS. 3A-3D. Either before or after lamination of actuator 70 (here, constructed from a single-film transducer with diametrically positioned bus bars 76a, 76b placed on opposite sides of the inactive portions of dielectric layer 74, collectively sandwiched between passive layers 78a, 78b) to a PCB/flex connector 72, the stacked transducer/actuator structure 70 is laser drilled 80 through its entire thickness to PCB 72 to form the via holes 82a, 82b, as illustrated in FIG. 3B. Other methods for creating the via holes can also be used such as mechanically drilling, punching, molding, piercing, and coring. The via holes are then filled by any suitable dispensing method, such as by injection, with a conductive material, e.g., carbon particles in silicone, as shown in FIG. 3C. Then, as shown in FIG. 3D, the conductively filled vias 84a, 84b are optionally potted 86a, 86b with any compatible non-conductive material, e.g., silicone, to electrically isolate the exposed end of the vias. Alternatively, a non-conductive tape may be placed over the exposed vias.

Figure 4A:
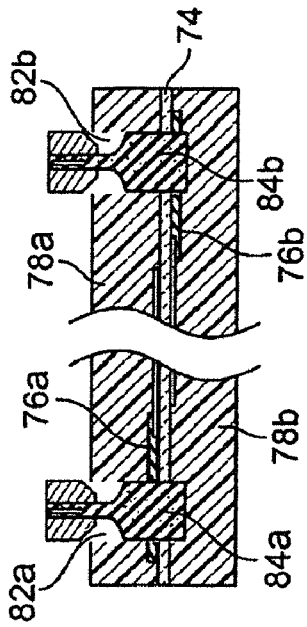
FIGS. 4A-4D illustrate various steps of a process for making electrical connections within the subject transducers for coupling to an electrical wire.
Figure 4B:
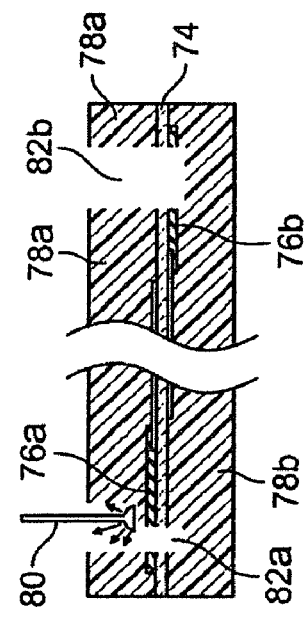
Figure 4C:
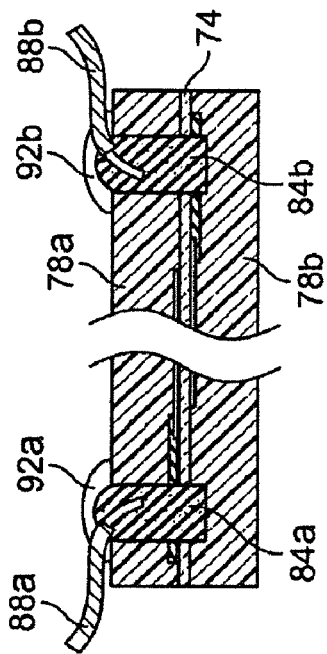
Figure 4D:
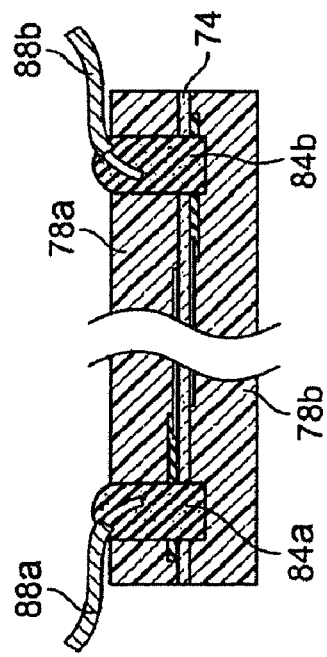

Standard electrical wiring may be used in lieu of a PCB or flex connector to couple the actuator to the power supply and electronics. Various steps of forming the electrical vias and electrical connections to the power supply with such embodiments are illustrated in FIGS. 4A-4D with like components and steps to those in FIGS. 3A-3D having the same reference numbers. Here, as shown in FIG. 4A, via holes 82a, 82b need only be drilled to a depth within the actuator thickness to the extent that the bus bars 84a, 84b are reached. The via holes are then filled with conductive material, as shown in FIG. 4B, after which wire leads 88a, 88b are inserted into the deposited conductive material, as shown in FIG. 4C. The conductively filled vias and wire leads may then be potted over, as shown in FIG. 4D.

FIG. 5 illustrates another manner of providing conductive vias within the transducers of the present invention. Transducer 100 has a dielectric film comprising a dielectric layer 104 having portions sandwiched between electrodes 106a, 106b, which in turn are sandwiched between passive polymer layers 110a, 110b. A conductive bus bar 108 is provided on an inactive area of the EAP film. A conductive contact 114 having a piercing configuration is driven, either manually or otherwise, through one side of the transducer to a depth that penetrates the bus bar material 108. A conductive trace 116 extends along PCB/flex connector 112 from the exposed end of piercing contact 114. This method of forming vias is particularly efficient as it eliminates the steps of drilling the via holes, rolling the via holes, placing a conductive wire in the via holes and potting the via holes.

The thickness mode EAP transducers of the present invention are usable in a variety of actuator applications with any suitable construct and surface feature presentation. FIGS. 6-10 illustrate exemplary thickness mode transducer/actuator applications.

FIG. 6A illustrates a thickness mode transducer 120 having a round construct which is ideal for button actuators for use in tactile or haptic feedback applications in which a user physically contacts a device, e.g., keyboards, touch screens, phones, etc. Transducer 120 is formed from a thin elastomeric dielectric polymer layer 122 and top and bottom electrode patterns 124a, 124b (the bottom electrode pattern is shown in phantom), best shown in the isolated view in FIG. 6B. Each of the electrode patterns 124 provides a stem portion 125 with a plurality of oppositely extending finger portions 127 forming a concentric pattern. The stems of the two electrodes are positioned diametrically to each other on opposite sides of the round dielectric layer 122 where their respective finger portions are in appositional alignment with each other to produce the pattern shown in FIG. 6A. While the opposing electrode patterns in this embodiment are identical and symmetrical to each other, other embodiments are contemplated where the opposing electrode patterns are asymmetric, in shape and/or the amount of surface area which they occupy. The portions of the transducer material in which the two electrode materials do not overlap define the inactive portions 128a, 128b of the transducer. An electrical contact 126a, 126b is provided at the base of each of the two electrode stem portions for electrically coupling the transducer to a source of power and control electronics (neither are shown). When the transducer is activated, the opposing electrode fingers are drawn together, thereby compressing dielectric material 122 therebetween with the inactive portions 128a, 128b of the transducer bulging to form surface features about the perimeter of the button and/or internally to the button as desired.

Figure 7:
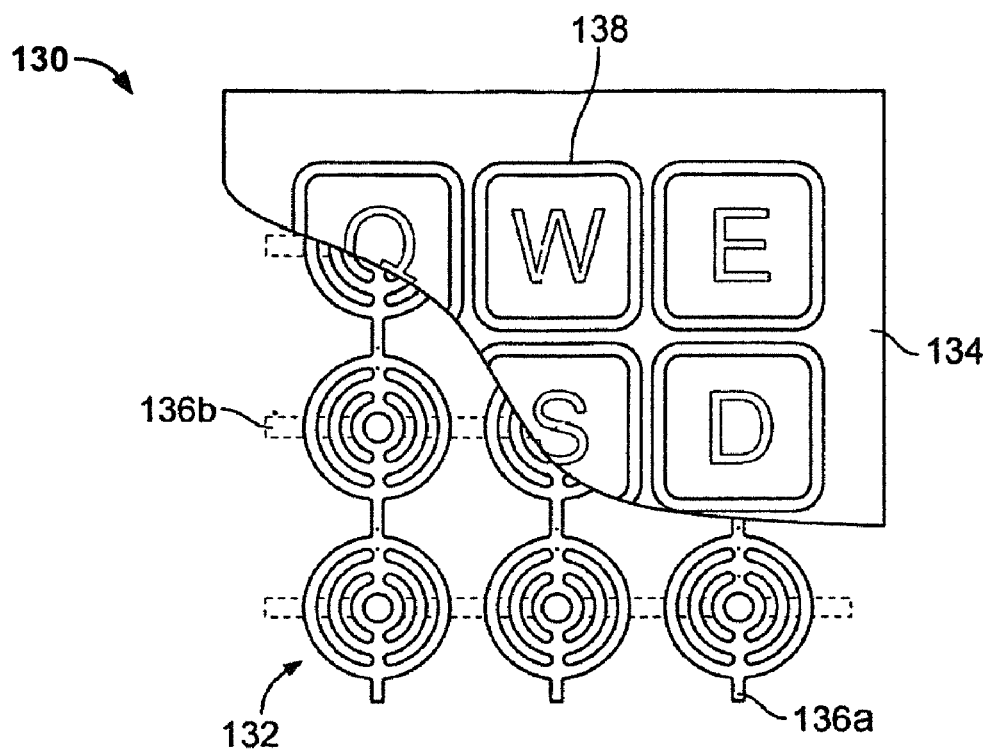
FIG. 7 illustrates a top cutaway view of a keypad employing an array of button-type actuators of FIGS. 6A and 6B.
Figure 8:
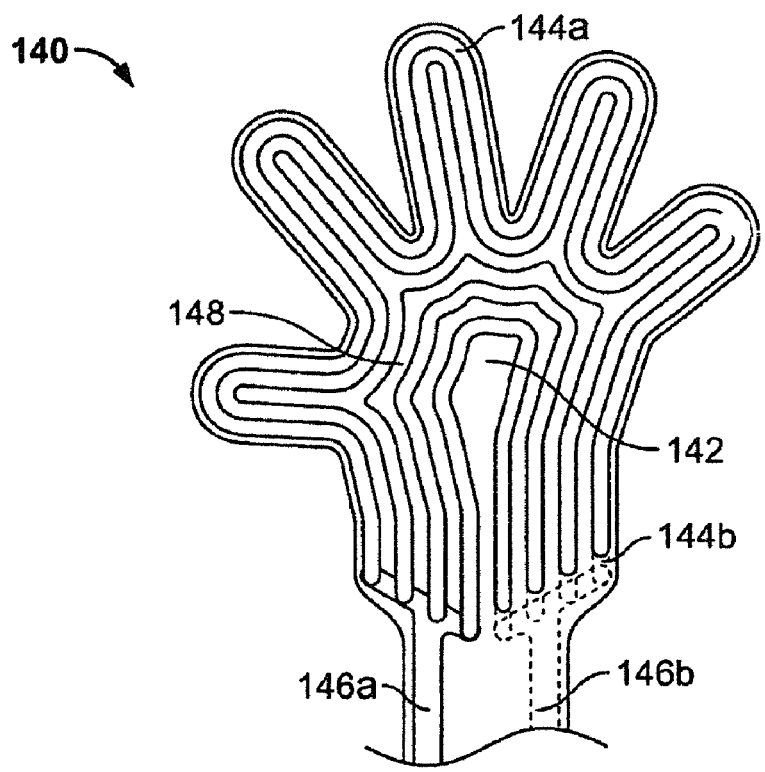
FIG. 8 illustrates a top view of a thickness mode transducer for use in a novelty actuator in the form of a human hand.

The button actuator may be in the form of a single input or contact surface or may be provided in an array format having a plurality of contact surfaces. When constructed in the form of arrays, the button transducers of FIG. 6A are ideal for use in keypad actuators 130, as illustrated in FIG. 7, for a variety of user interface devices, e.g., computer keyboards, phones, calculators, etc. Transducer array 132 includes a top array 136a of interconnected electrode patterns and bottom array 136b (shown in phantom) of electrode patterns with the two arrays opposed with each other to produce the concentric transducer pattern of FIG. 6A with active and inactive portions as described. The keyboard structure may be in the form of a passive layer 134 atop transducer array 132. Passive layer 134 may have its own surface features, such as key border 138, which may be raised in the passive state to enable the user to tactilely align his/her fingers with the individual key pads, and/or further amplify the bulging of the perimeter of the respective buttons upon activation. When a key is pressed, the individual transducer upon which it lays is activated, causing the thickness mode bulging as described above, to provide the tactile sensation back to the user. Any number of transducers may be provided in this manner and spaced apart to accommodate the type and size of keypad 134 being used. Examples of fabrication techniques for such transducer arrays are disclosed in U.S. patent application Ser. No. 12/163,554 filed on Jun. 27, 2008 entitled ELECTROACTIVE POLYMER TRANSDUCERS FOR SENSORY FEEDBACK APPLICATIONS, which is incorporated by reference in its entirety.

Those skilled in the art will appreciate that the thickness mode transducers of the present invention need not be symmetrical and may take on any construct and shape. The subject transducers may be used in any imaginable novelty application, such as the novelty hand device 140 illustrated in FIG. 8. Dielectric material 142 in the form of a human hand is provided having top and bottom electrode patterns 144a, 144b (the underside pattern being shown in phantom) in a similar hand shape. Each of the electrode patterns is electrically coupled to a bus bar 146a, 146b, respectively, which in turn is electrically coupled to a source of power and control electronics (neither are shown). Here, the opposing electrode patterns are aligned with or atop each other rather than interposed, thereby creating alternating active and inactive areas. As such, instead of creating raised surface features on only the internal and external edges of the pattern as a whole, raised surface features are provided throughout the hand profile, i.e., on the inactive areas. It is noted that the surface features in this exemplary application may offer a visual feedback rather than a tactile-feedback. It is contemplated that the visual feedback may be enhanced by coloring, reflective material, etc.

The transducer film of the present invention may be efficiently mass produced, particularly where the transducer electrode pattern is uniform or repeating, by commonly used web-based manufacturing techniques. As shown in FIG. 9, the transducer film 150 may be provided in a continuous strip format having continuous top and bottom electrical buses 156a, 156b deposited or formed on a strip of dielectric material 152. Most typically, the thickness mode features are defined by discrete (i.e., not continuous) but repeating active regions 158 formed by top and bottom electrode patterns 154a, 154b electrically coupled to the respective bus bars 156a, 156b the size, length, shape and pattern of which may be customized for the particular application. However, it is contemplated that the active region(s) may be provided in a continuous pattern. The electrode and bus patterns may be formed by known web-based manufacturing techniques, with the individual transducers then singulated, also by known techniques such as by cutting strip 150 along selected singulation lines 155. It is noted that where the active regions are provided continuously along the strip, the strip is required to be cut with a high degree of precision to avoid shorting the electrodes. The cut ends of these electrodes may require potting or otherwise may be etched back to avoid tracking problems. The cut terminals of buses 156a, 156b are then coupled to sources of power/control to enable actuation of the resulting actuators.

Either prior to or after singulation, the strip or singulated strip portions, may be stacked with any number of other transducer film strips/strip portions to provide a multi-layer stricture. The stacked structure may then be laminated and mechanically coupled, if so desired, to rigid mechanical components of the actuator, such an output bar or the like.

FIG. 10 illustrates another variation of the subject transducers in which a transducer 160 formed by a strip of dielectric material 162 with top and bottom electrodes 164a, 164b on opposing sides of the strip arranged in a rectangular pattern thereby framing an open area 165. Each of the electrodes terminates in an electrical bus 166a, 166b, respectively, having an electrical contact point 168a, 168b for coupling to a source of power and control electronics (neither being shown). A passive layer (not shown) that extends across the enclosed area 165 may be employed on either side of the transducer film, thereby forming a gasket configuration, for both environmental protection and mechanical coupling of the output bars (also not shown). As configured, activation of the transducer produces surface features along the inside and outside perimeters 169 of the transducer strip and a reduction in thickness of the active areas 164a 164b. It should be noted that the gasket actuator need not be a continuous, single actuator. One or more discrete actuators can also be used to line the perimeter of an area which may be optionally sealed with non-active compliant gasket material Other gasket-type actuators are disclosed in U.S. patent application Ser. No. 12/163,554, referenced above. These types of actuators are suitable for sensory (e.g., haptic or vibratory) feedback applications such as with touch sensor plates, touch pads and touch screens for application in handheld multimedia devices, medical instrumentation, kiosks or automotive instrument panels, toys and other novelty products, etc.

Figure 11A:
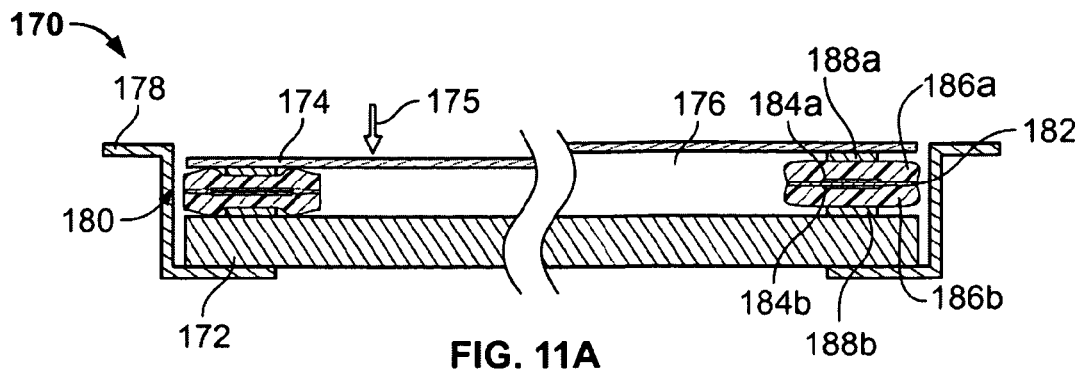
FIGS. 11A-11D are cross-sectional views of touch screens employing various type gasket-type actuators.
Figure 11B:
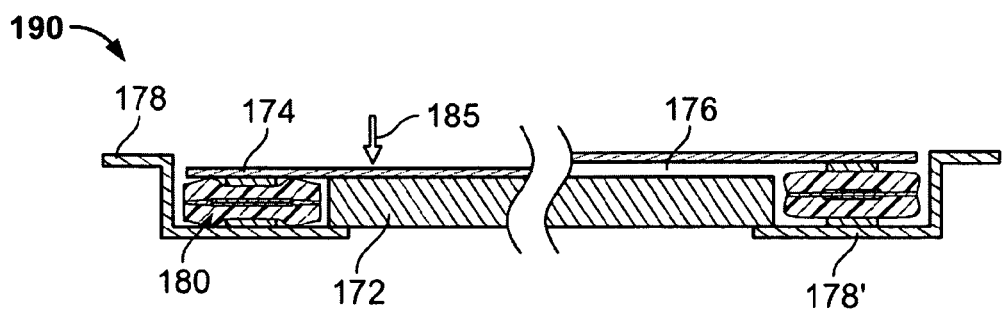
Figure 11C:
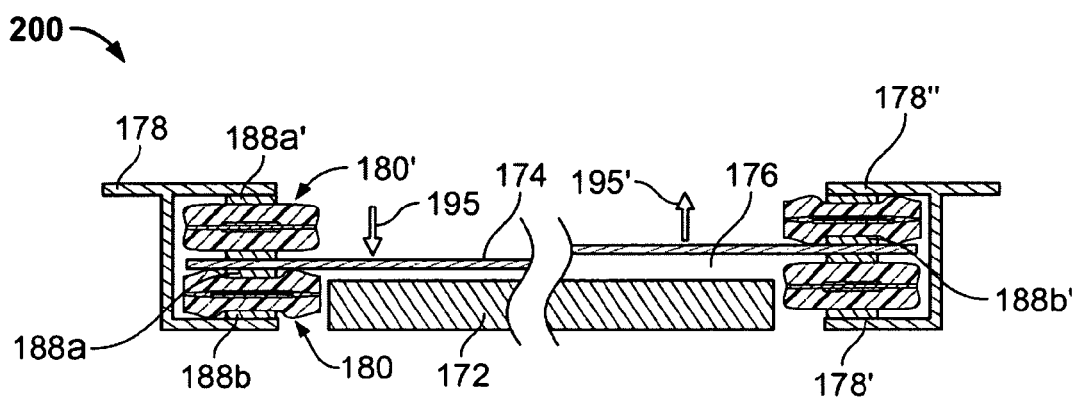

FIGS. 11A-11D are cross-sectional views of touch screens employing variations of a thickness mode actuator of the present invention with like reference numbers referencing similar components amongst the four figures. Referring to FIG. 11A, the touch screen device 170 may include a touch sensor plate 174, typically made of a glass or plastic material, and, optionally, a liquid crystal display (LCD) 172. The two are stacked together and spaced apart by EAP thickness mode actuator 180 defining an open space 176 therebetween. The collective stacked structure is held together by frame 178. Actuator 180 includes the transducer film formed by dielectric film layer 182 sandwiched centrally by electrode pair 184a, 184b. The transducer film is in turn sandwiched between top and bottom passive layers 186a, 186b and further held between a pair of output structures 188a, 188b which are mechanically coupled to touch plate 174 and LCD 172, respectively. The right side of FIG. 11A shows the relative position of the LCD and touch plate when the actuator is inactive, while the left side of FIG. 11A shows the relative positions of the components when the actuator is active, i.e., upon a user depressing touch plate 174 in the direction of arrow 175. As is evident from the left side of the drawing, when actuator 180 is activated, the electrodes 184a, 184b are drawn together thereby compressing the portion of dielectric film 182 therebetween while creating surface features in the dielectric material and passive layers 186a, 186b outside the active area, which surface features are further enhanced by the compressive force caused by output blocks 188a, 188b. As such, the surface features provide a slight force on touch plate 174 in the direction opposite arrow 175 which gives the user a tactile sensation in response to depressing the touch plate.

Figure 11D:
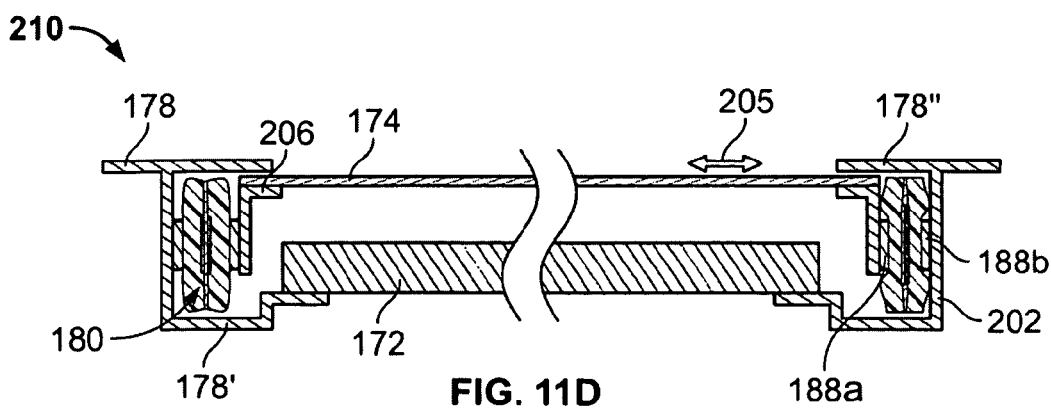

Touch screen device 190 of FIG. 11D has a similar construct to that of FIG. 11A with the difference being that LCD 172 wholly resides within the internal area framed by the rectangular (or square, etc.) shaped thickness mode actuator 180. As such, the spacing 176 between LCD 172 and touch plate 174 when the device is in an inactive state (as demonstrated on the right side of the figure) is significantly less than in the embodiment of FIG. 11A, thereby providing a lower profile design. Further, the bottom output structure 188b of the actuator rests directly on the back wall 178' of frame 178. Irrespective of the structural differences between the two embodiments, device 190 functions similarly to device 170 in that the actuator surface features provide a slight tactile force in the direction opposite arrow 185 in response to depressing the touch plate.

The two touch screen devices just described are single phase devices as they function in a single direction. Two (or more) of the subject gasket-type actuators may be used in tandem to produce a two phase (bidirectional) touch screen device 200 as in FIG. 11C. The construct of device 200 is similar to that of the device of FIG. 11B but with the addition of a second thickness mode actuator 180' which sits atop touch plate 174. The two actuators and touch plate 174 are held in stacked relation by way of frame 178 which has an added inwardly extending top shoulder 178". As such, touch plate 174 is sandwiched directly between the innermost output blocks 188a, 188b' of actuators 180, 180', respectively, while the outermost output blocks 188b, 188a' of actuators 180', respectively, buttress the frame members 178' and 178", respectively. This enclosed gasket arrangement keeps dust and debris out of the optical path within space 176. Here, the left side of the figure illustrates bottom actuator 180 in an active state and top actuator 180' in a passive state in which sensor plate 174 is caused to move towards LCD 172 in the direction of arrow 195. Conversely, the right side of the figure illustrates bottom actuator 180 in a passive state and top actuator 180' in an active state in which sensor plate 174 is caused to move away from LCD 172 in the direction of arrow 195'.

FIG. 11D illustrates another two phase touch sensor device 210 but with a pair of thickness mode strip actuators 180 oriented with the electrodes orthogonal to the touch sensor plate. Here, the two phase or bi-directional movement of touch plate 174 is in-plane as indicated by arrow 205. To enable such in-plane motion, the actuator 180 is positioned such that the plane of its EAP film is orthogonal to those of LCD 172 and touch plate 174. To maintain such a position, actuator 180 is held between the sidewall 202 of frame 178 and an inner frame member 206 upon which rests touch plate 174. While inner frame member 206 is affixed to the output block 188a of actuator 180, it and touch plate 174 are "floating" relative to outer frame 178 to allow for the in-plane or lateral motion. This construct provides a relatively compact, low-profile design as it eliminates the added clearance that would otherwise be necessary for two-phase out-of-plane motion by touch plate 174. The two actuators work in opposition for two-phase motion. The combined assembly of plate 174 and brackets 206 keep the actuator strips 180 in slight compression against the sidewall 202 of frame 178. When one actuator is active, it compresses or thins further while the other actuator expands due to the stored compressive force. This moves the plate assembly toward the active actuator. The plate moves in the opposite direction by deactivating the first actuator and activating the second actuator.

Figure 12A:
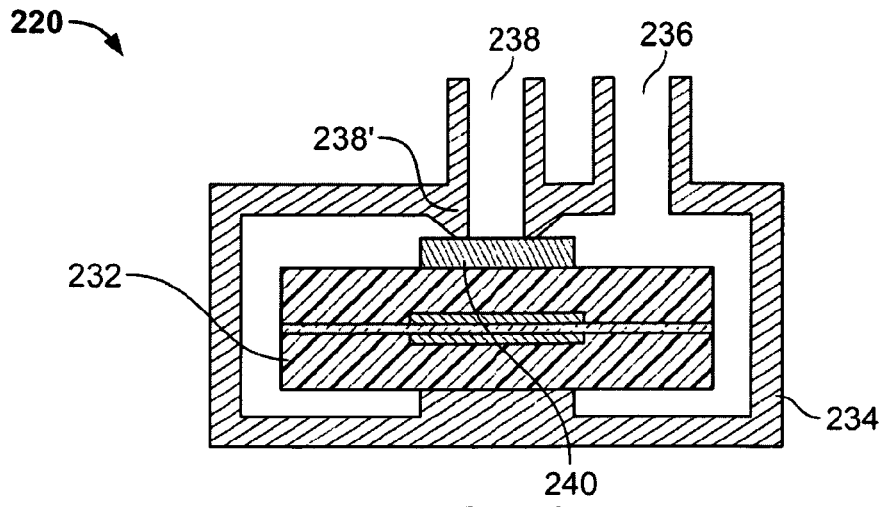
FIGS. 12A-12C are cross-sectional views of passive and active states, respectively, of a poppet valve mechanism employing the thickness mode actuators of the present invention.
Figure 12B:
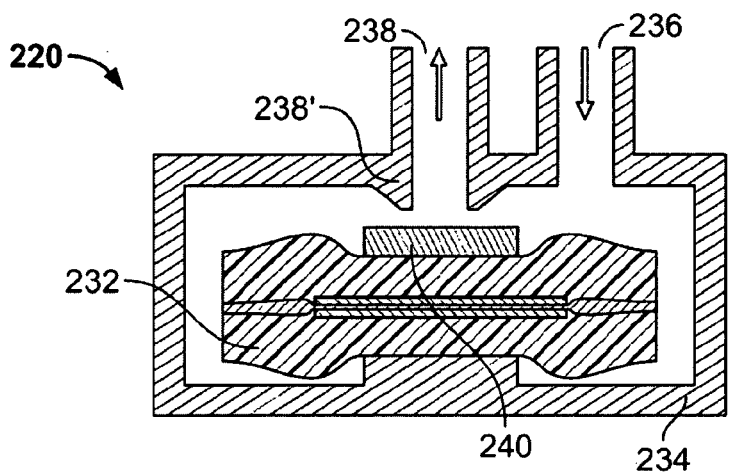

The subject transducers and actuators are also useful in fluid (i.e., liquid, gas, etc.) control and movement applications including valves and pump mechanisms. FIGS. 12A and 12B show a one-way poppet valve mechanism 220 employing thickness mode actuator 232. The actuator is seated within fluid chamber 234 having fluid inlet and outlet ports 236, 238, respectively. Actuator 232 is situation within chamber 234 such that its output structure 240 is aligned with outlet port 238. When actuator 232 is in a passive state, as shown in FIG. 12A, output structure 240 is buttressed against aperture 238' of the outlet port which defines the valve seat. As such, the valve has a normally closed configuration. As shown in FIG. 12B, the thickness mode operation of the actuator 232 when activated pulls output structure 240 away from valve seat 238' thereby allowing fluid within chamber 234 to exit through outlet port 238.

Figure 12C:
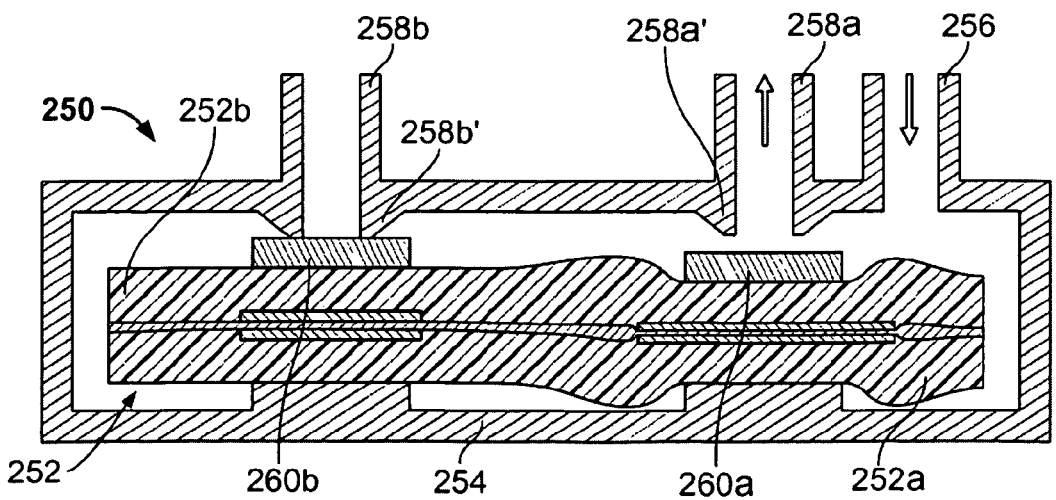

FIG. 12C illustrates a two-way poppet valve 250 having fluid chamber 254 with an inlet port 256 and two output ports 258a, 258b having respective apertures 258a', 258b'. An actuator mechanism 252 contained within the chamber includes two activatable portions 252a, 252b, each having an output structure 260a, 260b, respectively, aligned with output ports 258a, 258b, respectively. In the illustrated embodiment, actuator portion 252a is active while actuator portion 252b is inactive, thereby alternating fluid flow through the two outlet ports. However, both actuator portions may be activated in tandem, if desired. It can be appreciated that valve 250 may have any number of outlet port-actuator pairings with actuation function being accomplished with either a monolithic structure with a plurality of activatable portions, as illustrated, or a plurality of structurally discrete actuators. The individual actuators or actuator portions may be activated in tandem or independently, such that any combination of output flow is provided.

Figure 13A:
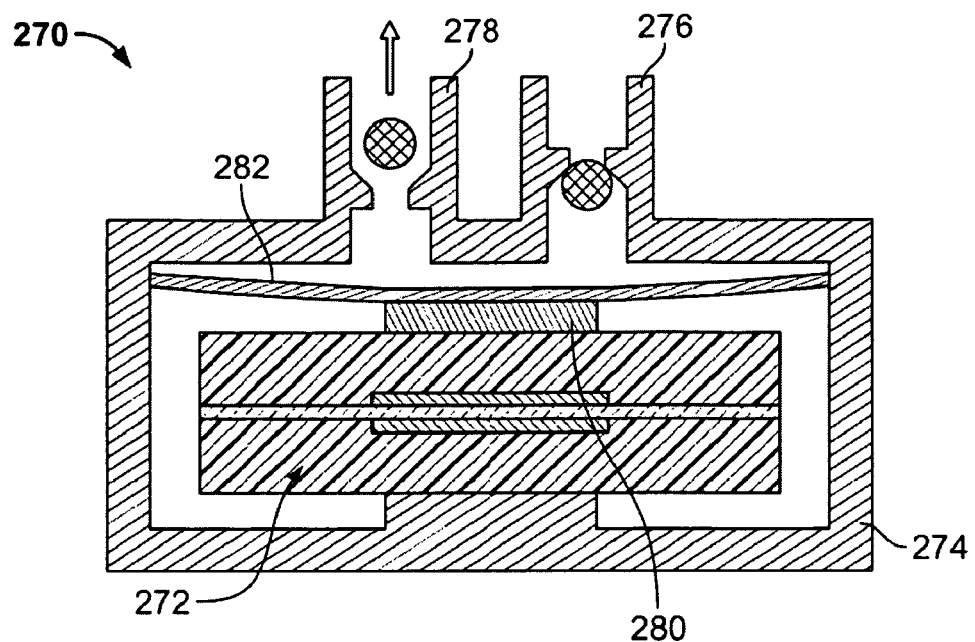
FIGS. 13A and 13B are cross-sectional views of passive and active states, respectively, of a diaphragm-type fluid pump employing a thickness mode actuator of the present invention.
Figure 13B:
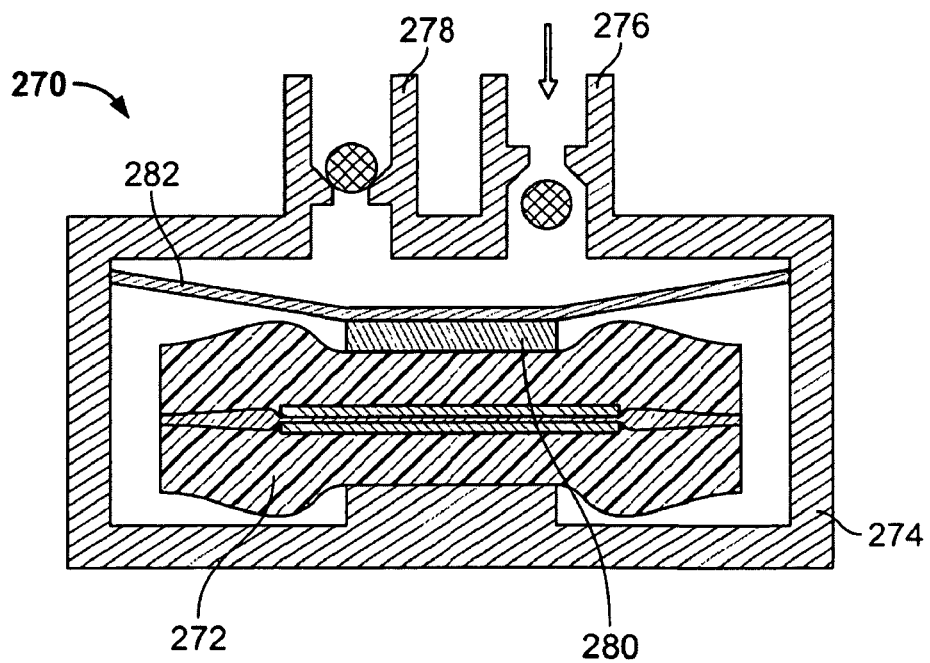

The subject actuators are also suitable for use with diaphragm type pumps. One such diaphragm pump 270 is shown in FIGS. 13A and 13B in which the fluid chamber 274 has inlet and outlet ports 276, 278, respectively, having check valves mechanisms to control fluid flow therethrough. The output structure 280 of thickness mode actuator 272 is affixed to the underside of a diaphragm 282 that extends between the sidewalls and across the upper end of chamber 274. The diaphragm is made of a material stiff enough to not flex or stretch under compression pressure, e.g., fiber reinforced rubbers, stiff elastomers, filled silicone, a thin metal membrane, etc. Activating and deactivating actuator 272 moves diaphragm 282 away and towards, respectively, the inlet and outlet ports. With the positive pressure created in chamber 274 when diaphragm 274 is moved towards the ports, as illustrated in FIG. 13A, outlet check valve 278 is caused to open allow fluid to be exhausted from the chamber. Conversely, with the negative pressure created in chamber 274 when diaphragm 274 is moved away from the ports, as illustrated in FIG. 13B, inlet check valve 278 is caused to open, creating fluid intake to the chamber.

FIGS. 14A and 14B illustrate another diaphragm-type pump employing thickness mode a multi-actuator mechanism 276. The actuator has three activatable portions 276a-c (but may have more or fewer portions), with the outer two portions 276a, 276c being aligned relative to inlet-outlet ports 274a, 274b, respectively, of fluid chamber 292. Diaphragm 298 is coupled at its underside to the respective output structures 300a-c of the actuator portions. To exhaust fluid from chamber 292, one or both ports 294a, 294b are opened, as illustrated in FIG. 14A, by activating outer actuators 296a, 296c. Conversely, deactivating the outer actuators while activating the center actuator 296b, as illustrated in FIG. 14B, closes both valve ports while also priming the pump for the next exhaust stroke. Diaphragm sheet 298 may employ multiple materials so as to facilitate the poppet valve sealing, for example, the membrane could be made of a metal foil with rubber coating over the valve area.

The multi-phase linear actuator mechanisms of the present invention are also highly suitable for use with peristaltic pumps, such as pump 310 of FIGS. 15A and 15B. Pump 310 comprises a chamber or conduit (which may have any suitable cross-sectional shape, e.g., cylindrical, rectangular, square, etc.) having a base 312a and a top portion or cover 312b. Thickness mode actuator mechanism 318, here having four activatable portions illustrated, is offset from base 312a by output or mounting structures 314a. The opposing output structures 314b are coupled to the underside of diaphragm 316. The spacing provided by the offset of the structures 314a,314b allow for the thickness mode bulging of the inactive portions and the compressing of the active portions of the actuator strip 318. Fluid is caused to linearly move between diaphragm 316 and top cover 312b by sequential activation and deactivation of the various active portions of actuator 318. The flow rate may be varied by controlling the on-off rate of the active portions. Optionally, a fixed diaphragm 322 may be mounted to the underside of top cover 312b to facilitate fluid flow dynamics through the passageway 320 defined between the two diaphragms or to provide a disposable fluid path (with the actuator and housing being non-disposable).

FIG. 15B illustrates another peristaltic pump 330 with a simplified design in that the diaphragm(s) and top output structures of the peristaltic pump of FIG. 15A have been eliminated. As such, the top passive layer 324 of actuator 318 takes the function of previous diaphragm 316, with fluid passing through the spacing 326 between the passive layer and the top cover or 312b.

Figure 16A:
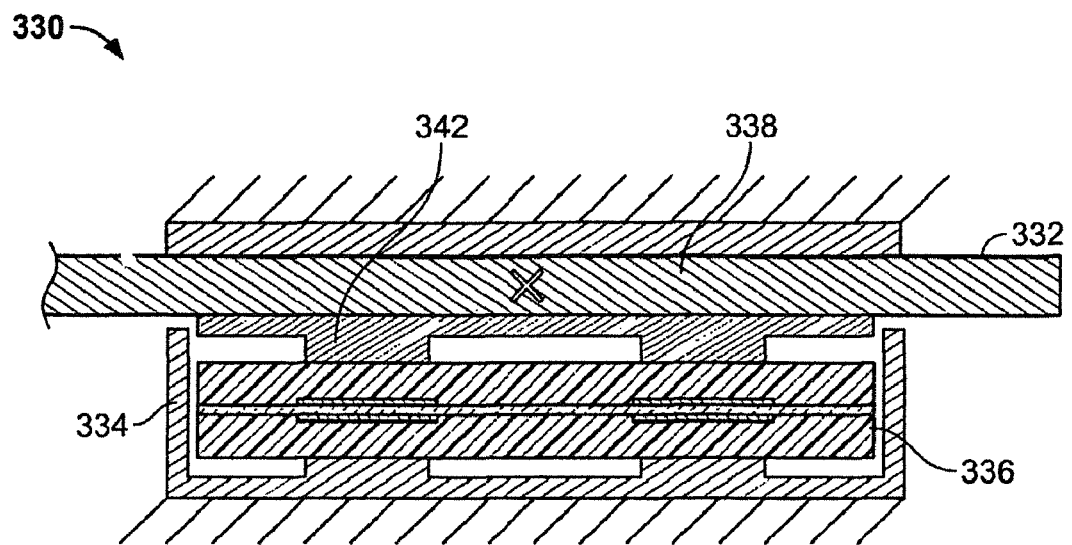
FIGS. 16A and 16B are cross-sectional views of a linear brake mechanism employing the thickness mode actuators of the present invention in passive and active modes, respectively.
Figure 16B:
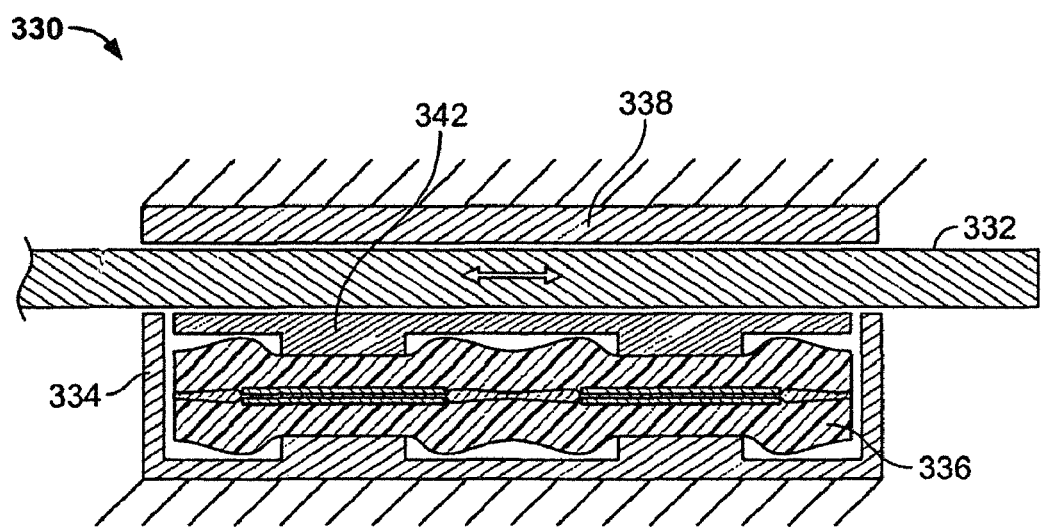

The subject thickness mode actuators are also very useful in brake/clutch applications. FIGS. 16A and 16B illustrate a proportional linear braking system 330 in which a moveable member 332 (such as those used for commonly known rod bearing arrangement) is linearly translatable within the spacing between a grounded structure 338 and a brake mechanism 334. The brake includes thickness mode actuator mechanism 336 positioned within housing 334, which is also grounded. Actuator 336 may have one or more active areas (i.e., two active areas are employed here) depending on the surface area of member 332 and the breaking force required to stop its movement. For maximum breaking force (as well as for maximum clearance), all of the active areas are activated/deactivated simultaneously. In the passive state, as illustrated in FIG. 16A, the output plate 342 of the actuators is in a closed or extended position, thereby clamping member 332 against grounding pad 338. In the active state, as illustrated in FIG.

16B, output plate 342 is open or receded within housing 334, providing clearance for the linear movement of member 332.

Figure 17A:
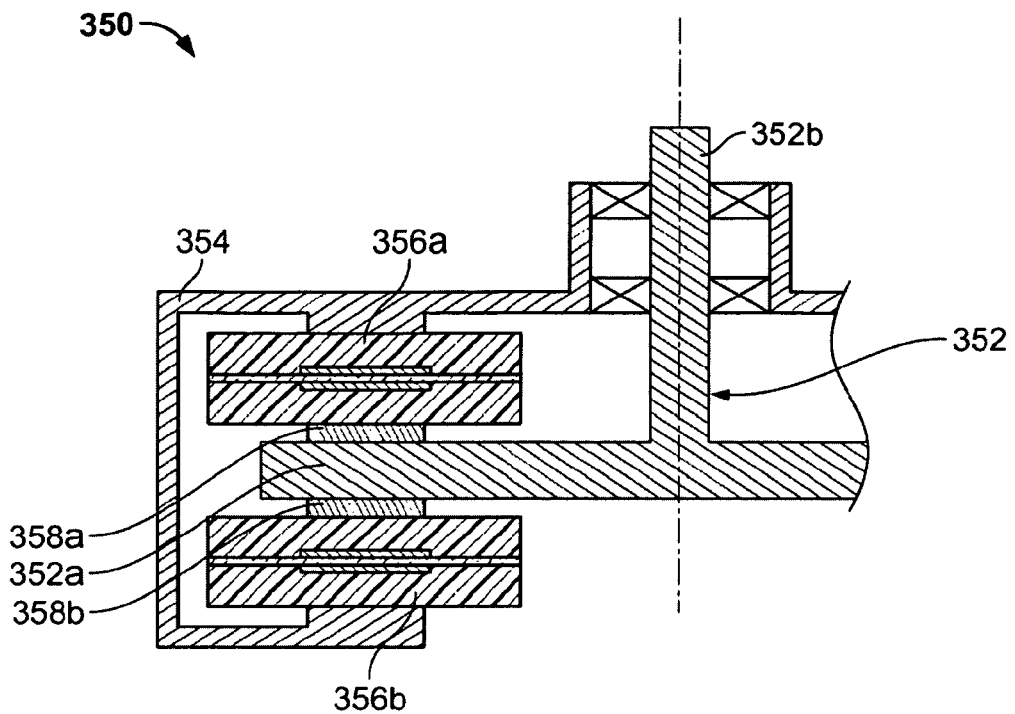
FIGS. 17A and 17B are cross-sectional views of a rotary brake or clutch mechanism employing the thickness mode actuators of the present invention in passive and active modes, respectively.
Figure 17B:
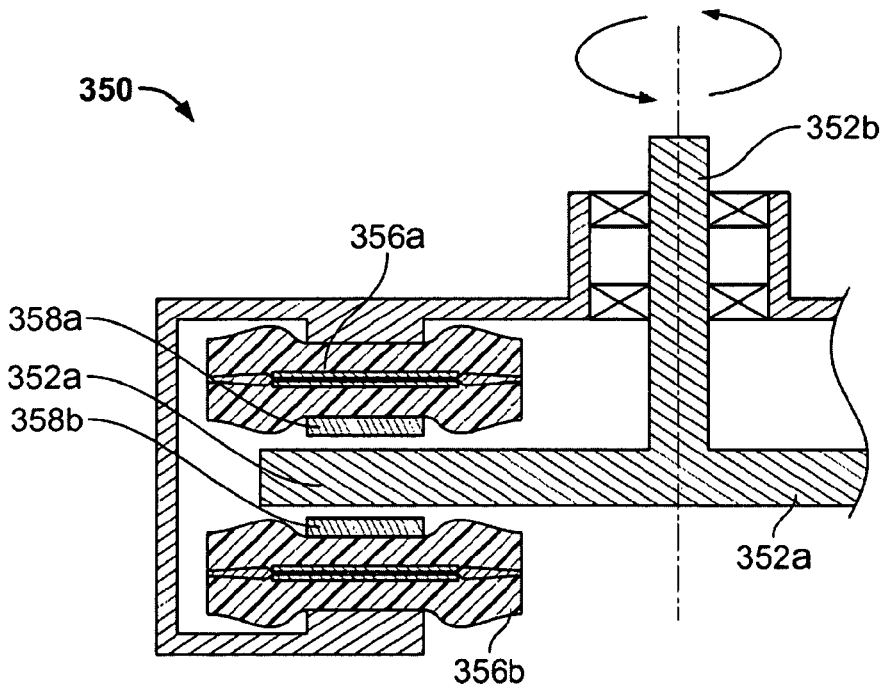

FIGS. 17A and 17B illustrate a rotary braking system 350 having a rotary disc 352 having a disc element 352a and an axial shaft 352b. The braking actuators 356a, 356b are mounted in stacked relationship within a housing 354. Disc 352 is positioned within the spacing between inwardly facing output members or braking or clutch pads 358a, 35b, respectively. When actuators 356a, 356b are inactive and in their highest profile, as illustrated in FIG. 17A, they are caused to clamp down and stop the rotation of disc 352. When the actuators are active and in a compressed state, disc 352 is unclamped and allowed to move therethrough. The amount of braking force applied to disc 352a can be proportioned by either activating one of the two actuators or activating them both in tandem but at a decreased voltage to reduce their respective output displacement.

The transducer/actuator embodiments described thus far have the passive layer(s) coupled to both the active (i.e., areas including overlapping electrodes) and inactive regions of the EAP transducer film. Where the transducer/actuator has also employed a rigid output structure, that structure has been positioned over areas of the passive layers that reside above the active regions. Further, the active/activatable regions of these embodiments have been positioned centrally relative to the inactive regions. The present invention also includes other transducer/actuator configurations. For example, the passive layer(s) may cover only the active regions or only the inactive regions. Additionally, the inactive regions of the EAP film may be positioned centrally to the active regions.

FIGS. 18A and 18B illustrate one such variation in which the inactive area is positioned internally or centrally to the active region(s), i.e., the central portion of the EAP film is devoid of overlapping electrodes. Thickness mode actuator 360 includes EAP transducer film comprising dielectric layer 362 sandwiched between electrode layers 364a, 364b in which a central portion 365 of the film is passive and devoid of electrode material. The EAP film is held in a taut or stretched condition by at least one of top and bottom frame members 366a, 366b, collectively providing a cartridge configuration. Covering at least one of the top and bottom sides of the passive portion 365 of the film are passive layers 368a, 368b with optional rigid constraints or output members 370a, 370b mounted thereon, respectively. With the EAP film constrained at its perimeter by cartridge frame 366, when activated (see FIG. 18B), the compression of the EAP film causes the film material to retract inward, as shown by arrows 367a, 367b, rather than outward as with the above-described actuator embodiments. The compressed EAP film impinges on the passive material 368a, 368b causing its diameter to decrease and its height to increase. This change in configuration applies outward forces on output members 370a, 370b, respectively. As with the previously described actuator embodiments, the passively coupled film actuators may be provided in multiples in stacked or planar relationships to provide multi-phase actuation and/or to increase the output force and/or stroke of the actuator.

Performance may be enhanced by prestraining the dielectric film and/or the passive material. The actuator may be used as a key or button device and may be stacked or integrated with sensor devices such as membrane switches. The bottom output member or bottom electrode can be used to provide sufficient pressure to a membrane switch to complete the circuit or can complete the circuit directly if the bottom output member has a conductive layer. Multiple actuators can be used in arrays for applications such as keypads or keyboards.

The various dielectric elastomer and electrode materials disclosed in U.S. Patent Application Publication No. 2005/0157893 are suitable for use with the thickness mode transducers of the present invention. Generally, the dielectric elastomers include any substantially insulating, compliant polymer, such as silicone rubber and acrylic, that deforms in response to an electrostatic force or whose deformation results in a change in electric field. In designing or choosing an appropriate polymer, one may consider the optimal material, physical, and chemical properties. Such properties can be tailored by judicious selection of monomer (including any side chains), additives, degree of cross-linking, crystallinity, molecular weight, etc.

Electrodes described therein and suitable for use include structured electrodes comprising metal traces and charge distribution layers, textured electrodes, conductive greases such as carbon greases or silver greases, colloidal suspensions, high aspect ratio conductive materials such as conductive carbon black, carbon fibrils, carbon nanotubes, graphene and metal nanowires, and mixtures of ionically conductive materials. The electrodes may be made of a compliant material such as elastomer matrix containing carbon or other conductive particles. The present invention may also employ metal and semi-inflexible electrodes.

Exemplary passive layer materials for use in the subject transducers include but are not limited to silicone, styrenic or olefinic copolymer, polyurethane, acrylate, rubber, a soft polymer, a soft elastomer (gel), soft polymer foam, or a polymer/gel hybrid, for example. The relative elasticity and thickness of the passive layer(s) and dielectric layer are selected to achieve a desired output (e.g., the net thickness or thinness of the intended surface features), where that output response may be designed to be linear (e.g., the passive layer thickness is amplified proportionally to the that of the dielectric layer when activated) or non-linear (e.g., the passive and dielectric layers get thinner or thicker at varying rates).

Regarding methodology, the subject methods may include each of the mechanical and/or activities associated with use of the devices described. As such, methodology implicit to the use of the devices described forms part of the invention. Other methods may focus on fabrication of such devices.

As for other details of the present invention, materials and alternate related configurations may be employed as within the level of those with skill in the relevant art. The same may hold true with respect to method-based aspects of the invention in terms of additional acts as commonly or logically employed. In addition, though the invention has been described in reference to several examples, optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. Any number of the individual parts or subassemblies shown may be integrated in their design. Such changes or others may be undertaken or guided by the principles of design for assembly.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in the appended claims, tile singular forms "a," "an," "said," and "the" include plural referents unless the specifically stated otherwise. In other words, use of the articles allow for "at least one" of the subject item in the description above as well as the claims below. It is further noted that claims may be drafted to exclude any optional element. As such, this statement is intended to serve as antecedent basis for use of such exclusive terminology as "solely," "only" and the like in connection with the recitation of claim elements, or use of a "negative" limitation. Without the use of such exclusive terminology, the term "comprising" in tile claims shall allow for the inclusion of any additional element—irrespective of whether a given number of elements are enumerated in the claim, or the addition of a feature could be regarded as transforming the nature of an element set forth n the claims. Stated otherwise, unless specifically defined herein, all technical and scientific terms used herein are to be given as broad a commonly understood meaning as possible while maintaining claim validity.

In all, the breadth of the present invention is not to be limited by the examples provided. That being said, we claim.

What is claimed is:

1. A transducer comprising:
   an electroactive polymer film comprising a thin dielectric elastomer layer, wherein a portion of the dielectric elastomer layer is sandwiched between first and second electrodes wherein the overlapping portions of the electrodes define an active film region with the remaining portion of film defining an inactive film region;
   a first conductive layer disposed on at least a portion of the inactive film region and electrically coupled to the first electrode, and a second conductive layer disposed on at least a portion of the inactive film region and electrically coupled to the second electrode;
   at least one passive polymer layer, the polymer layer extending over at least a portion of one side of the electroactive polymer film, wherein activation of the active region changes a thickness dimension of the passive polymer layer; and
   a first conductive via extending through the transducer at a location which includes the first electrode and a second conductive via extending through the transducer at a location which includes the second electrode.

2. The transducer of claim 1 further comprising at least one rigid output structure mounted to a passive polymer layer.

3. The transducer of claim 2 further comprising a rigid output structure mounted to each passive polymer layer.

4. The transducer of claim 1 comprising two passive polymer layers, one on each side of the electroactive polymer film.

5. The transducer of claim 1, wherein the transducer is used to provide haptic feedback.

6. The transducer of claim 5 wherein the haptic feedback is provided for a touch screen device, a touch panel, a button, a key or a pointing device.

7. The transducer of claim 1, wherein the active region is central to the inactive region.

8. The transducer of claim 7, wherein the passive layer extends over the active and the inactive regions.

9. The transducer of claim 7, wherein the transducer is used to provide haptic feedback.

10. The transducer of claim 1, wherein the inactive region is central to the active region.

11. The transducer of claim 10, wherein the passive layer extends over only the inactive region.

12. A transducer assembly comprising;
    at least two stacked layers of electroactive polymer film, each electroactive polymer film
    comprising a thin dielectric elastomer layer, wherein a portion of the dielectric elastomer layer is sandwiched between first and second electrodes wherein the overlapping portions of the electrodes define an active film region with the remaining portion of film defining an inactive film region, wherein the active film regions of the respective layers of electroactive polymer film are in stacked alignment and the inactive active film regions of the respective layers of electroactive polymer film are in stacked alignment;
    a first conductive layer disposed on at least a portion of the inactive film region of each electroactive polymer film and electrically coupled to the first electrode thereof, and a second conductive layer disposed on at least a portion of the inactive film region of each electroactive polymer film and electrically coupled to the second electrode thereof; and
    a first conductive via extending through the stacked electroactive polymer films at a location which includes the first electrode of each film and a second conductive via extending through the stacked electroactive polymer films at a location which includes the second electrodes.

* * * * *